(12) United States Patent
Kim

(10) Patent No.: US 9,379,333 B2
(45) Date of Patent: Jun. 28, 2016

(54) FLUORENE-BASED COMPOUND AND ORGANIC LIGHT-EMITTING DEVICE INCLUDING THE SAME

(71) Applicant: Samsung Display Co., Ltd., Yongin, Gyeonggi-Do (KR)

(72) Inventor: Hee-Yeon Kim, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 370 days.

(21) Appl. No.: 14/134,450

(22) Filed: Dec. 19, 2013

(65) Prior Publication Data

US 2014/0191214 A1     Jul. 10, 2014

(30) Foreign Application Priority Data

Jan. 4, 2013    (KR) .......................... 10-2013-0001312

(51) Int. Cl.
 *H01L 51/50* (2006.01)
 *H01L 51/00* (2006.01)

(52) U.S. Cl.
 CPC .......... *H01L 51/006* (2013.01); *H01L 51/0052* (2013.01); *H01L 51/5056* (2013.01)

(58) Field of Classification Search
None
See application file for complete search history.

(56) References Cited

U.S. PATENT DOCUMENTS

| 7,431,997 B2 | 10/2008 | Hwang et al. |
| 2002/0182439 A1 | 12/2002 | Tao et al. |
| 2006/0269781 A1 * | 11/2006 | Lai ........................ C07C 211/58 428/690 |

FOREIGN PATENT DOCUMENTS

| JP | 2005-120030 | * 5/2005 | ............. C09K 11/06 |
| JP | 2005-120030 | 12/2005 | |
| KR | 10-0573137 | 4/2006 | |

OTHER PUBLICATIONS

Adachi et al., Durability Characteristics of Aminopyrene Dimer Molecules as an Emitter in Organic Multilayered Elec9-4825troluminescent Diodes, 1996, Jpn. J. Appl. Phys., vol. 35, pp. 4819-4825.*

*Primary Examiner* — Gregory Clark
(74) *Attorney, Agent, or Firm* — Robert E. Bushnell, Esq.

(57) ABSTRACT

A fluorene-based compound represented by Formula 1 below and an organic light-emitting device (OLED) including the fluorene-based compound.

Formula 1

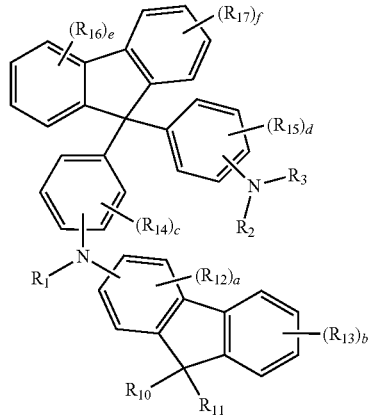

wherein $R_1$ to $R_3$, $R_{10}$ to $R_{17}$ and a, b, c, d, e, and f are defined as in the specification.

18 Claims, 1 Drawing Sheet

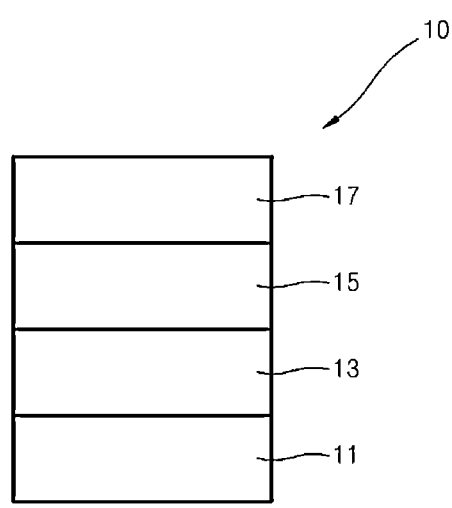

FLUORENE-BASED COMPOUND AND ORGANIC LIGHT-EMITTING DEVICE INCLUDING THE SAME

CLAIM OF PRIORITY

This application makes reference to, incorporates the same herein, and claims all benefits accruing under 35 U.S.C. §119 from an application for FLUORENE-BASED COMPOUND AND ORGANIC LIGHT-EMITTING DEVICE INCLUDING THE SAME, earlier filed in the Korean Intellectual Property Office on Jan. 4, 2013 and there duly assigned Serial No. 10-2013-0001312.

BACKGROUND OF THE INVENTION

1. Field of the Invention

The present invention relates to a fluorene-based compound and an organic light-emitting device including the same.

2. Description of the Related Art

An organic light-emitting device (OLED), which is a self-emitting device, has advantages such as wide viewing angles, excellent contrast, quick response, high brightness, excellent driving voltage characteristics, and multicolored images.

A typical OLED has a structure including an anode formed on top of a substrate, a hole transport layer (HTL), an emission layer (EML), an electron transport layer (ETL), and a cathode, which are sequentially stacked on top of the anode. In this regard, the HTL, the EML, and the ETL are organic thin films formed of organic compounds.

An operating principle of an OLED having the above-described structure is as follows:

When a voltage is applied between the anode and the cathode, holes injected from the anode move to the EML via the HTL, and electrons injected from the cathode move to the EML via the ETL. Carriers such as the holes and the electrons recombine in the EML regions to generate excitons. When the excitons drop from an excited state to a ground state, light is emitted.

SUMMARY OF THE INVENTION

The present invention provides a new fluorene-based compound and an organic light-emitting device (OLED) including the same.

According to an aspect of the present invention, there is provided a fluorene-based compound represented by Formula 1:

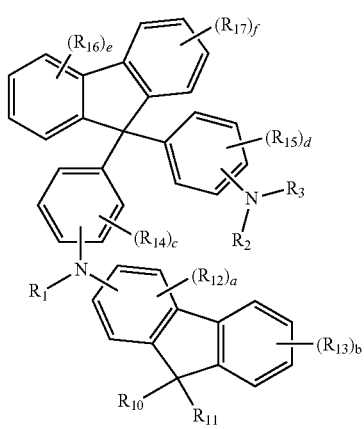

Formula 1

In formula 1, $R_1$ to $R_3$ may each be independently selected from a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{30}$ aryl group, or a substituted or unsubstituted $C_2$-$C_{30}$ heteroaryl group, and $R_2$ and $R_3$ may be optionally connected to each other by a single bond, —O—, —S—, a substituted or unsubstituted $C_1$-$C_5$ alkylene group, or a substituted or unsubstituted $C_2$-$C_5$ alkenylene group.

In formula 1, $R_{10}$ to $R_{17}$ may each be independently selected from hydrogen, deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ heterocycloalkyl group, a substituted or unsubstituted $C_2$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthiogroup, a substituted or unsubstituted $C_2$-$C_{60}$ heteroaryl group, and —N($Q_1$)($Q_2$), and —Si($Q_3$)($Q_4$)($Q_5$), wherein $Q_1$ to $Q_5$ may each be independently selected from hydrogen, deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthiogroup, and a substituted or unsubstituted $C_2$-$C_{60}$ heteroaryl group.

In Formula 1, a, c, and d may each be independently an integer between 1 to 3, and b, e, and f may each be independently an integer between 1 to 4.

According to another aspect of the present invention, there is provided an organic light-emitting device (OLED) including a first electrode, a second electrode disposed opposite to the first electrode, and an organic layer disposed between the first electrode and the second electrode, the organic layer including an emission layer (EML) and at least one kind of the fluorene-based compounds.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein:

FIG. 1 is a view schematically illustrating a structure of an organic light-emitting device (OLED) according to an embodiment of the present invention.

DETAILED DESCRIPTION OF THE INVENTION

As used herein, the term "and/or" includes any and all combinations of one or more of the associated listed items. Expressions such as "at least one of," when preceding a list of elements, modify the entire list of elements and do not modify the individual elements of the list.

According to an aspect of the present invention, there is provided a fluorene-based compound represented by Formula 1:

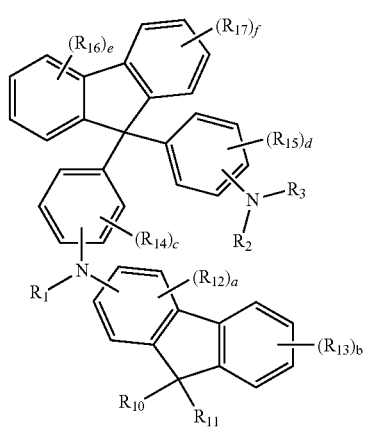

Formula 1

In Formula 1, $R_1$ to $R_3$ may each be independently selected from a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{30}$ aryl group, and a substituted or unsubstituted $C_2$-$C_{30}$ heteroaryl group. Herein, $R_2$ and $R_3$ may be optionally connected to each other by a single bond, —O, —S—, a substituted or unsubstituted $C_1$-$C_5$ alkylene group, or a substituted or unsubstituted $C_2$-$C_5$ alkenylene group.

According to an embodiment of the present invention, $R_1$ to $R_3$ in Formula 1 may each be independently selected from a cyclopropyl group, a cyclobutyl group, a cyclopentyl group, a cyclohexyl group, a cycloheptyl group, a cyclooctyl group, a cyclopentenyl group, a cyclopentadienyl group, a cyclohexenyl group, a cyclohexadienyl group, a cycloheptadienyl group, a thiophenyl group, a furanyl group, a pyrrolyl group, an imidazolyl group, a pyrazolyl group, an isothiazolyl group, an isoxazole group, a thiazolyl group, an oxazolyl group, an oxadiazolyl group, a thiadiazolyl group, a triazolyl group, a phenyl group, a pyrydinyl group, a pyrazinyl group, a pyrymidinyl group, a pyrydazinyl group, a triazinyl group, a pentalenyl group, an indenyl group, a naphtyl group, an azulenyl group, a heptalenyl group, a biphenyl group, an indacenyl group, an acenaphthylenyl group, a fluorenyl group, a spirofluorenyl group, a carbazolyl group, an anthryl group, a phenalenyl group, a phenanthrenyl group, a pherylenyl group, a fluoranthenyl group, a naphtalsenyl group, a picenyl group, a pentaphenyl group, a hexacenyl group, a dibenzofuranyl group, a dibenzotiophenyl group, a phenothiazinyl group, a phenoxazinyl group, a dihydrophenazinyl group, phenoxathinyl group, and a phenanthridinyl group; and a cyclopropyl group, a cyclobutyl group, a cyclopentyl group, a cyclohexyl group, a cycloheptyl group, a cyclooctyl group, a cyclopentenyl group, a cyclopentadienyl group, a cyclohexenyl group, a cyclohexadienyl group, a cycloheptadienyl group, a thiophenyl group, a furanyl group, a pyrrolyl group, an imidazolyl group, a pyrazolyl group, an isothiazolyl group, an isoxazole group, a thiazolyl group, an oxazolyl group, an oxadiazolyl group, a thiadiazolyl group, a triazolyl group, a phenyl group, a pyrydinyl group, a pyrazinyl group, a pyrymidinyl group, a pyrydazinyl group, a triazinyl group, a pentalenyl group, an indenyl group, a naphtyl group, an azulenyl group, a heptalenyl group, a biphenyl group, an indacenyl group, an acenaphthylenyl group, a fluorenyl group, a spirofluorenyl group, a carbazolyl group, an anthryl group, a phenalenyl group, a phenanthrenyl group, a pherylenyl group, a fluoranthenyl group, a naphtalsenyl group, a picenyl group, a pentaphenyl group, a hexacenyl group, a dibenzofuranyl group, a dibenzotiophenyl group, a phenothiazinyl group, a phenoxazinyl group, a dihydrophenazinyl group, phenoxathinyl group, and a phenanthridinyl group, substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthiogroup, a $C_2$-$C_{60}$ heteroaryl group, a phenyl-$C_2$-$C_{60}$ heteroaryl group, and —N($Q_{11}$)($Q_{12}$) (herein, $Q_{11}$ and $Q_{12}$ may each be independently a hydrogen atom, a $C_1$-$C_{10}$ alkyl group, a $C_6$-$C_{20}$ arylene group, or a $C_2$-$C_{20}$ heteroaryl group).

For example $R_1$ to $R_3$ in Formula 1 may each be independently selected from a phenyl group, a pyrydinyl group, a pyrazinyl group, a pyrymidinyl group, a pyrydazinyl group, a triazinyl group, a naphtyl group, a fluorenyl group, a spirofluorenyl group, a carbazolyl group, an anthryl group, a phenalenyl group, and a phenanthrenyl group; and a phenyl group, a pyrydinyl group, a pyrazinyl group, a pyrymidinyl group, a pyrydazinyl group, a triazinyl group, a naphtyl group, a fluorenyl group, a spirofluorenyl group, a carbazolyl group, an anthryl group, a phenalenyl group, and a phenanthrenyl group, substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphtyl group, an anthryl group a phenyl-carbazolyl group, a pyrydinyl group, a pyrymidinyl group, and a pyrazinyl group, but examples of $R_1$ to $R_3$ in Formula 1 are not limited thereto.

In Formula 1, $R_1$ to $R_3$ may each be independently selected from a phenyl group; a dimethylfluorenyl group; a biphenyl group; a naphtyl group; a phenyl-carbazolyl group; a phenyl group substituted with a phenyl-carbazolyl group; and an anthryl group, but examples of $R_1$ to $R_3$ in Formula 1 are not limited thereto.

In Formula 1, $R_2$ and $R_3$ may exist as independent of each other or may be connected to each other by a single bond. For example, $R_2$ and $R_3$ in Formula 1 may be connected to each other by a single bond.

In Formula 1, $R_{10}$ to $R_{17}$ may each be independently selected from hydrogen, deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ heterocycloalkyl group, a substituted or unsubstituted $C_2$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthiogroup, a substituted or unsubstituted $C_2$-$C_{60}$ heteroaryl group, —N($Q_1$)($Q_2$), and —Si($Q_3$)($Q_4$)($Q_5$). Herein, $Q_1$ to $Q_5$ may each be independently selected from hydrogen, deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthiogroup, and a substituted or unsubstituted $C_2$-$C_{60}$ heteroaryl group.

In Formula 1, $R_{10}$ and $R_{11}$ may each be independently selected from a $C_1$-$C_{60}$ alkyl group and a $C_6$-$C_{14}$ aryl group; and a $C_1$-$C_{60}$ alkyl group and a $C_6$-$C_{14}$ aryl group, substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphtyl group, and an anthryl group.

According to another embodiment of the present invention, $R_{10}$ and $R_{11}$ in Formula 1 may each be selected from a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonenyl group, an isononenyl group, a sec-nonenyl group, a tert-nonenyl group, an n-decanyl group, an isodecanyl group, a sec-decanyl group, a tert-decanyl group; a phenyl group, a naphtyl group, and an anthryl group; and a phenyl group, a naphtyl group, and an anthryl group, substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonenyl group, an isononenyl group, a sec-nonenyl group, a tert-nonenyl group, an n-decanyl group, an isodecanyl group, a sec-decanyl group, a tert-decanyl group, a phenyl group, a naphtyl group, and an anthryl group.

For example, $R_{10}$ and $R_{11}$ in Formula 1 may be a methyl group.

Meanwhile, $R_{10}$ and $R_{11}$ in Formula 1 may be connected to each other by a single bond.

In Formula 1, $R_{12}$ to $R_{17}$ may each be independently selected from hydrogen, deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonenyl group, an isononenyl group, a sec-nonenyl group, a tert-nonenyl group, an n-decanyl group, an isodecanyl group, a sec-decanyl group, and a tert-decanyl group; a cyclopropyl group, a cyclobutyl group, a cyclopentyl group, a cyclohexyl group, a cycloheptyl group, a cyclooctyl group, a cyclopentenyl group, a cyclopentadienyl group, a cyclohexenyl group, a cyclohexadienyl group, a cycloheptadienyl group, a thiophenyl group, a furanyl group, a pyrrolyl group, an imidazolyl group, a pyrazolyl group, an isothiazolyl group, an isoxazole group, a thiazolyl group, an oxazolyl group, an oxadiazolyl group, a thiadiazolyl group, a triazolyl group, a phenyl group, a pyrydinyl group, a pyrazinyl group, a pyrymidinyl group, a pyrydazinyl group, a triazinyl group, a pentalenyl group, an indenyl group, a naphtyl group, an azulenyl group, a heptalenyl group, a biphenyl group, an indacenyl group, an acenaphthylenyl group, a fluorenyl group, a spirofluorenyl group, a carbazolyl group, an anthryl group, a phenalenyl group, a phenanthrenyl group, a pherylenyl group, a fluoranthenyl group, a naphtalsenyl group, a picenyl group, a pentaphenyl group, a hexacenyl group, a dibenzofuranyl group, a dibenzotiophenyl group, a phenothiazinyl group, a phenoxazinyl group, a dihydrophenazinyl group, a phenoxathinyl group, and a phenanthridinyl group; and a cyclopropyl group, a cyclobutyl group, a cyclopentyl group, a cyclohexyl group, a cycloheptyl group, a cyclooctyl group, a cyclopentenyl group, a cyclopentadienyl group, a cyclohexenyl group, a cyclohexadienyl group, a cycloheptadienyl group, a thiophenyl group, a furanyl group, a pyrrolyl group, an imidazolyl group, a pyrazolyl group, an isothiazolyl group, an isoxazole group, a thiazolyl group, an oxazolyl group, an oxadiazolyl group, a thiadiazolyl group, a triazolyl group, a phenyl group, a pyrydinyl group, a pyrazinyl group, a pyrymidinyl group, a pyrydazinyl group, a triazinyl group, a pentalenyl group, an indenyl group, a naphtyl group, an azulenyl group, a heptalenyl group, a biphenyl group, an indacenyl group, an acenaphthylenyl group, a fluorenyl group, a spirofluorenyl group, a carbazolyl group, an anthryl group, a phenalenyl group, a phenanthrenyl group, a pherylenyl group, a fluoranthenyl group, a naphtalsenyl group, a picenyl group, a pentaphenyl group, a hexacenyl group, a dibenzofuranyl group, a dibenzotiophenyl group, a phenothiazinyl group, a phenoxazinyl group, a dihydrophenazinyl group, a phenoxathinyl group, and a phenanthridinyl group, substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonenyl group, an isononenyl group, a sec-nonenyl group, a tert-nonenyl group, an n-decanyl group, an isodecanyl group, a sec-decanyl group, a tert-decanyl group, a phenyl group, a naphtyl group, and an anthryl group.

For example, $R_{12}$ to $R_{17}$ in Formula 1 may each be independently selected from hydrogen, deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonenyl group, an isononenyl group, a sec-nonenyl group, a tert-nonenyl group, an n-decanyl group, an isodecanyl group, a sec-decanyl group, a tert-decanyl group, a phenyl group, a naphtyl group, and an anthryl group, but examples of $R_{12}$ to $R_{17}$ in Formula 1 are not limited thereto. According to another embodiment of the present invention, $R_{12}$ to $R_{17}$ in Formula 1 may be hydrogen atoms.

In Formula 1, a, c, and d may each be independently an integer number between 1 to 3; and b, e, and f may each be independently an integer between 1 to 4.

The a represents a number of $R_{12}$ so that when a is more than 2, plurality of $R_{12}$ may be the same or different from each other. The b represents a number of $R_{13}$ so that when the b is more than 2, plurality of $R_{13}$ may be the same or different from each other. The c represents a number of $R_{14}$ so that when the c is more than 2, plurality of $R_{14}$ may be the same or different from each other. The d represents a number of $R_{15}$ so that when the d is more than 2, plurality of $R_{15}$ may be the same or different from each other. The e represents a number of $R_{16}$ so that when the e is more than 2, plurality of $R_{16}$ may be the same or different from each other. The f represents a number of $R_{17}$ so that when the f is more than 2, plurality of $R_{17}$ may be the same or different from each other.

The fluorene-based compound may be represented by Formula 1A:

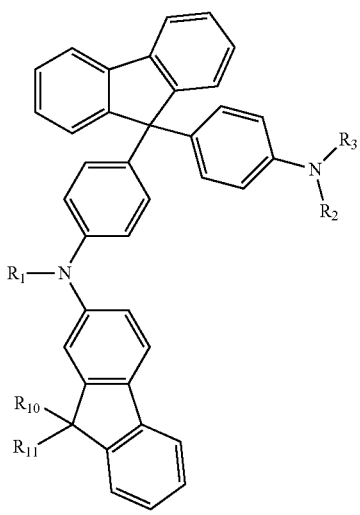

Formula 1A

A detailed description for $R_1$ to $R_3$, $R_{10}$ and $R_{11}$ in Formula 1A is referred to what is described in the present specification.

In Formula 1A, $R_1$ to $R_3$ may each be independently selected from a phenyl group, a pyrydinyl group, a pyrazinyl group, a pyrymidinyl group, a pyrydazinyl group, a triazinyl group, a naphtyl group, a fluorenyl group, a spirofluorenyl group, a carbazolyl group, an anthryl group, a phenalenyl group, and a phenanthrenyl group; and a phenyl group, a pyrydinyl group, a pyrazinyl group, a pyrymidinyl group, a pyrydazinyl group, a triazinyl group, a naphtyl group, a fluorenyl group, a spirofluorenyl group, a carbazolyl group, an anthryl group, a phenalenyl group, and a phenanthrenyl group, substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphtyl group, an anthryl group, a phenyl-carbazolyl group, a pyrydinyl group, a pyrymidinyl group, and a pyrazinyl group; and $R_{10}$ and $R_{11}$ may each be selected from a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonenyl group, an isononenyl group, a sec-nonenyl group, a tert-nonenyl group, an n-decanyl group, an isodecanyl group, a sec-decanyl group, a tert-decanyl group; a phenyl group, a naphtyl group, and an anthryl group; and a phenyl group, a naphtyl group, and an anthryl group, substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonenyl group, an isononenyl group, a sec-nonenyl group, a tert-nonenyl group, an n-decanyl group, an isodecanyl group, a sec-decanyl group, a tert-decanyl group, a phenyl group, a naphtyl group, and an anthryl group.

The fluorene-based compound may be represented by Formula 1B:

Formula 1B

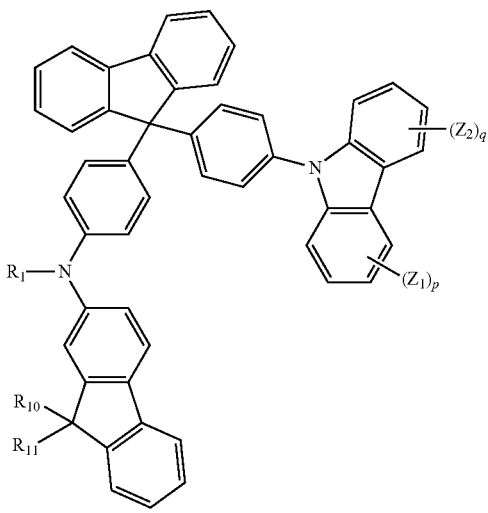

In Formula 1B, a detailed description for $R_1$, $R_{10}$, and $R_{11}$ is referred to what is described in the present specification.

In Formula 1B, R1 may be selected from a phenyl group, a pyrydinyl group, a pyrazinyl group, a pyrymidinyl group, a pyrydazinyl group, a triazinyl group, a naphtyl group, a fluorenyl group, a spirofluorenyl group, a carbazolyl group, an anthryl group, a phenalenyl group, and a phenanthrenyl group; and a phenyl group, a pyrydinyl group, a pyrazinyl group, a pyrymidinyl group, a pyrydazinyl group, a triazinyl group, a naphtyl group, a fluorenyl group, a spirofluorenyl group, a carbazolyl group, an anthryl group, a phenalenyl group, and a phenanthrenyl group that are substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphtyl group, an anthryl group a phenyl-carbazolyl group, a pyrydinyl group, a pyrymidinyl group, and a pyrazinyl group; $Z_1$ and $Z_2$ may each be independently selected from hydrogen, deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphtyl group, and an anthryl group; p and q are may each be independently an integer between 1 to 4; and $R_{10}$ and $R_{11}$ may each be independently selected from a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonenyl group, an isononenyl group, a sec-nonenyl group, a tert-nonenyl group, an n-decanyl group, an isodecanyl group, a sec-decanyl group, a tert-decanyl group; a phenyl group, a naphtyl group, and an anthryl group; and a phenyl group, a naphtyl group, and an anthryl group, substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonenyl group, an isononenyl group, a sec-nonenyl group, a tert-nonenyl group, an n-decanyl group, an isodecanyl group, a sec-decanyl group, a tert-decanyl group, a phenyl group, a naphtyl group, and an anthryl group.

According to another embodiment of the present invention, the fluorene-based compound may be any kind of Compounds 1 to 23, but is not limited thereto.

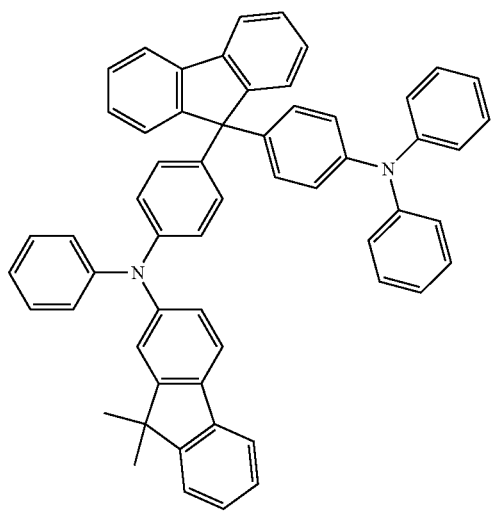

1

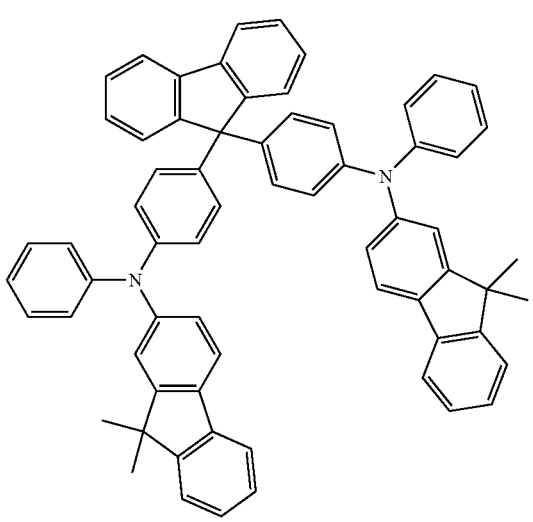

2

3
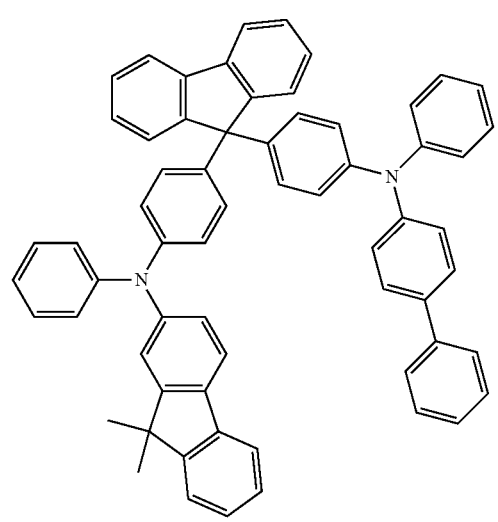
4
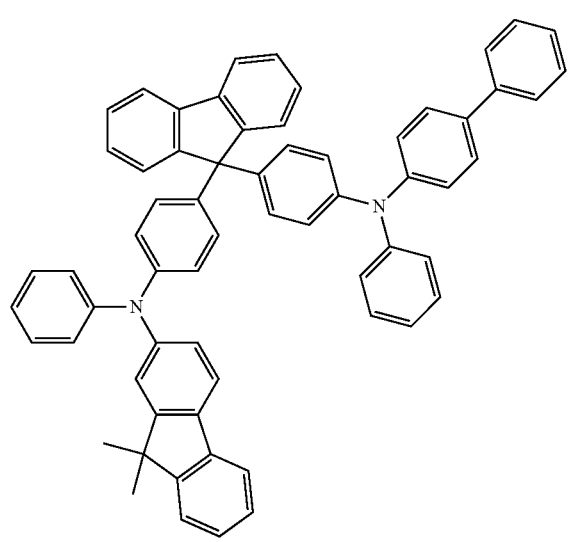
5
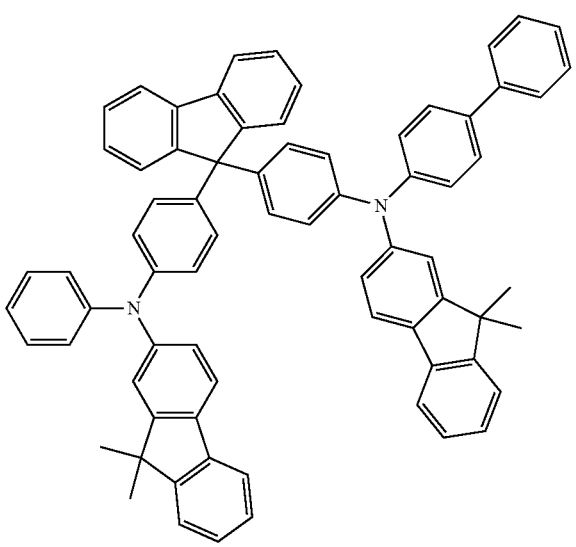
6
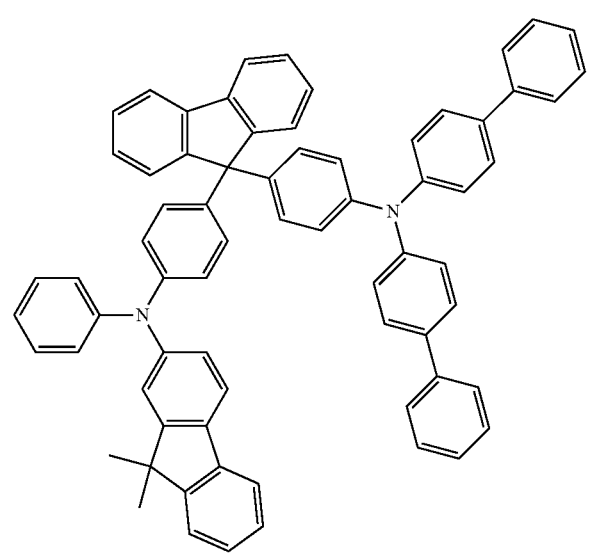
7
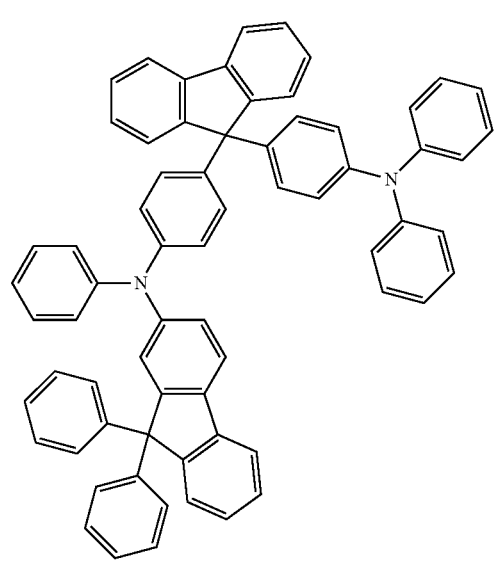
8
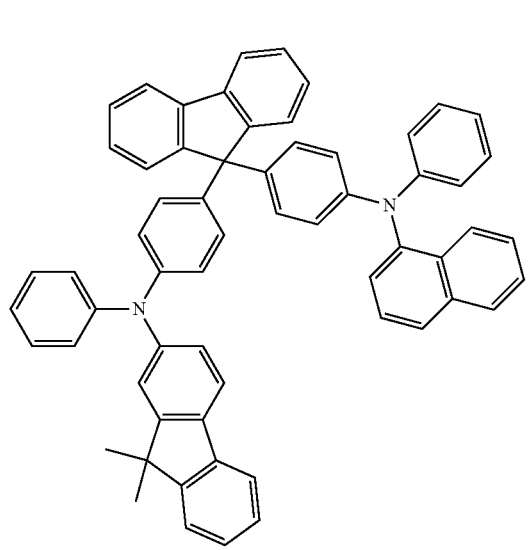

-continued
9
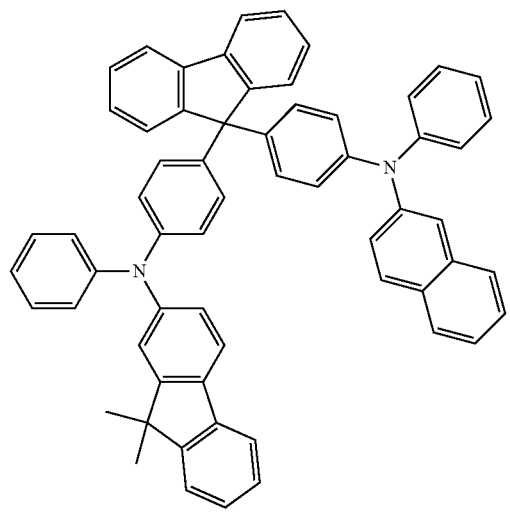
10
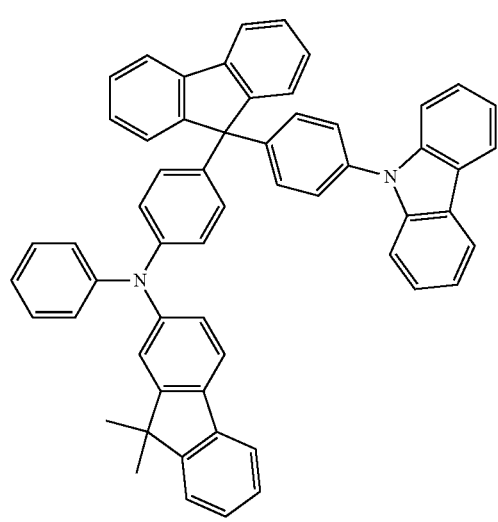
11
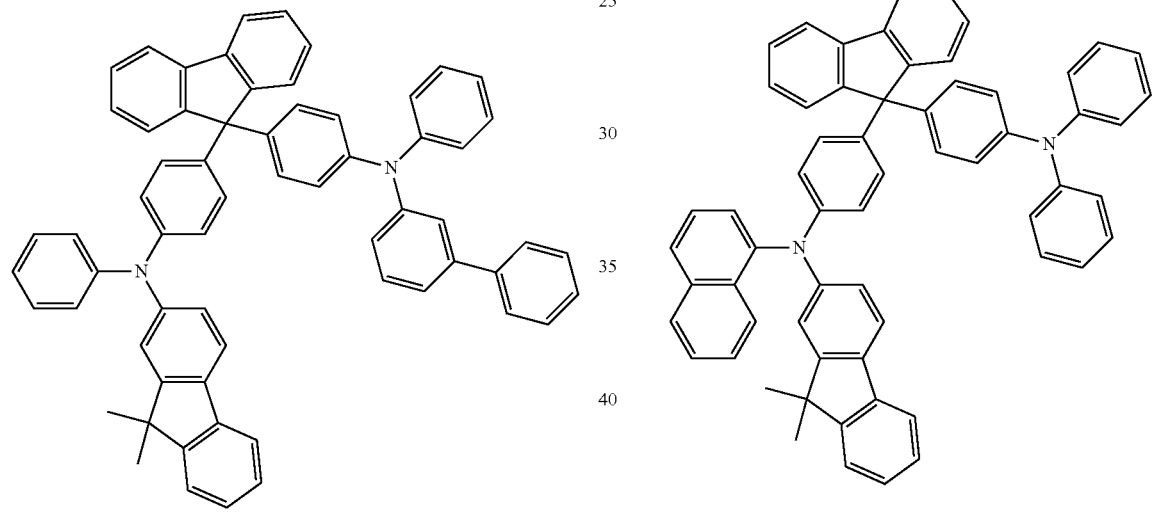
-continued
12
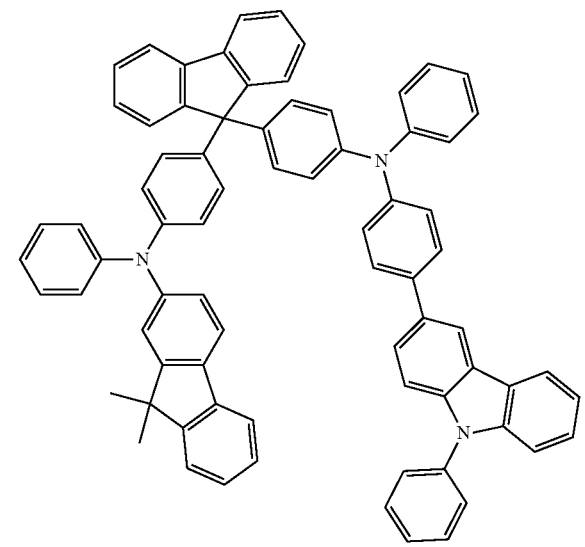
13
14

15
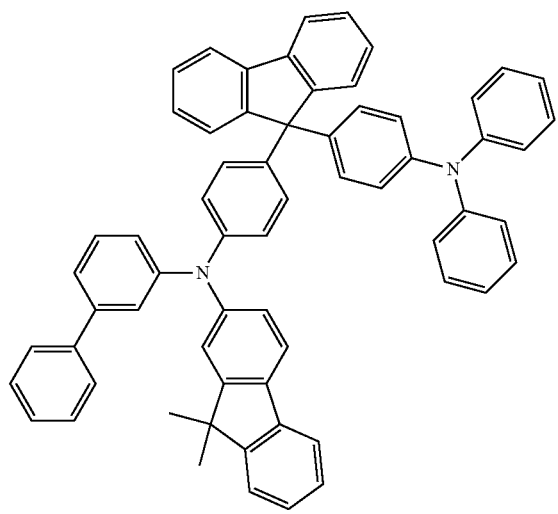
16
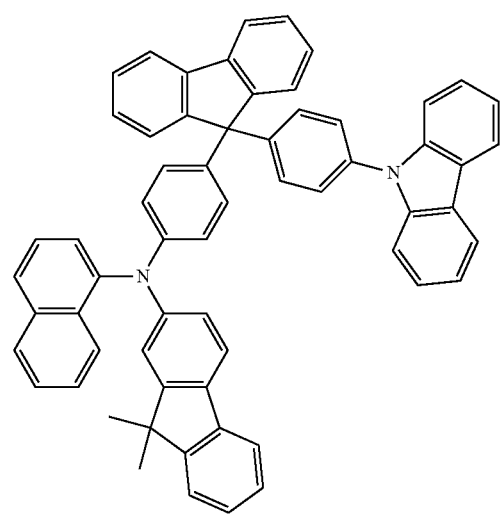
17
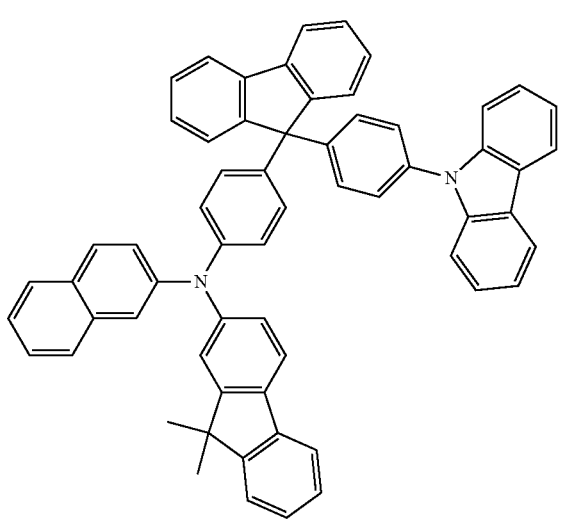
18
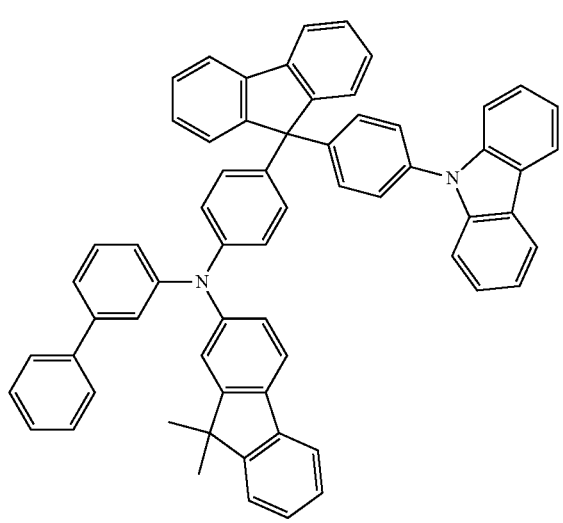
19
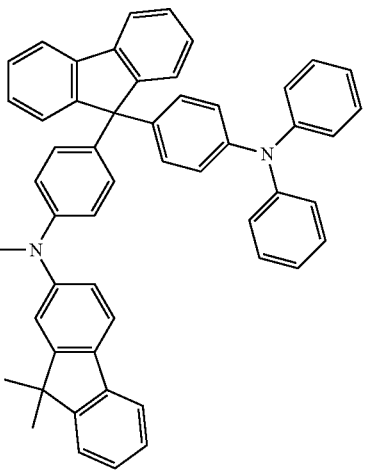
20
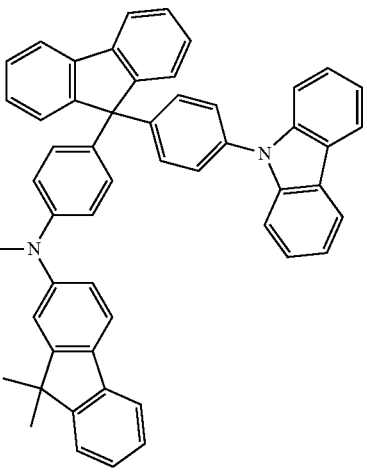

-continued

21

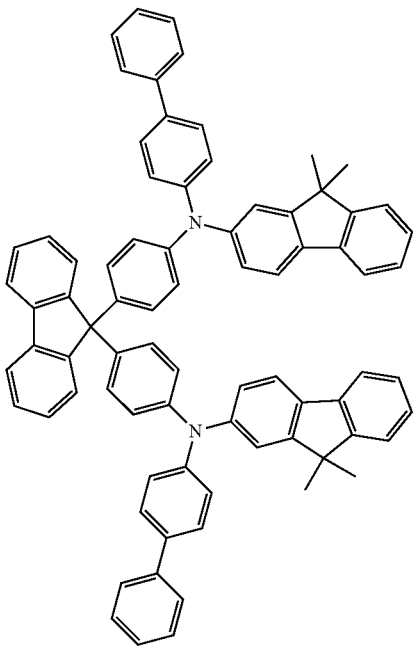

22

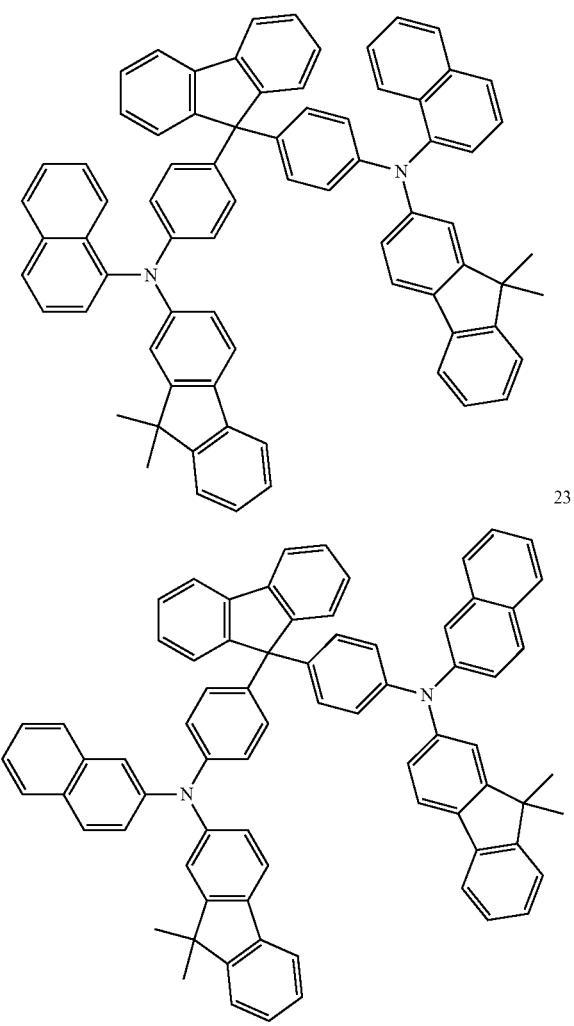

23

-continued

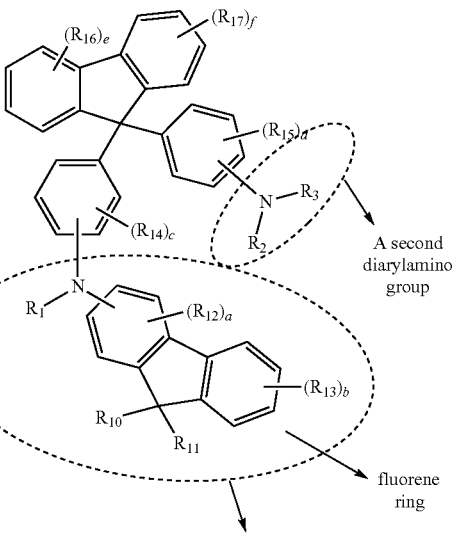

Formula 1'

A second diarylamino group fluorene ring

A first diarylamino group

The fluorene-based compound represented by Formula 1 may include "a first diarylamino group" and "a second diarylamino group" as shown in Formula 1'. Thus, the fluorene-based compound represented by Formula 1 may have a favorable HOMO energy level in a hole transport so that an OLED including the fluorene-based compound represented by Formula 1 may have a low driving voltage and high efficiency.

For example, when an OLED includes a hypothetical compound of the same formula as Formula 1 as a hole transport layer (HTL) material, except that only one of the "first diarylamino group" and the "second diarylamino group" is included therein, hole injection cannot be substantially carried out due to a high energy barrier of the hypothetical compound. Thus, an OLED including the hypothetical compound (i.e., disposed between an anode and an emission layer) may have a high driving voltage and low efficiency.

In addition, as shown in Formula 1', "the first diarylamino group" essentially include a fluorene ring. Due to the fluorene ring included in "the first diarylamino group", the fluorene-based compound represented by Formula 1 may have high quantum efficiency so that an OLED including the fluorene-based compound may have high efficiency.

Therefore, an OLED including the fluorene-based compound represented by Formula 1 may have advantages such as low driving voltages, high efficiency, high brightness, high color purity, and a long life.

The fluorene-based compound represented by Formula 1 may be synthesized by using a known organic synthesis method. A synthesis method of the fluorene-based compound may be easily recognized by one of ordinary skill in the art with reference to Examples described later.

The fluorene-based compound represented by Formula 1 may be used between a pair of electrodes of an OLED. For example, the fluorene-based compound represented by Formula 1 may be used in at least one of a hole injection layer (HIL), hole transport layer (HTL), a layer having both hole injection and hole transport capabilities at the same time.

According to another aspect of the present invention, there is provided an OLED including a first electrode, a second electrode disposed opposite to the first electrode, and an organic layer disposed between the first electrode and the second electrode, the organic layer including an emission layer and at least one of the fluorene-based compound represented by Formula 1 as described above.

The term "a layer (organic layer) including at least one of the fluorene-based compounds" as used herein may refer to "a layer (organic layer) including one of the fluorene-based compound of Formula 1 or at least two different kinds of the fluorene-based compounds of Formula 1".

For example, the organic layer may only include Compound 1 as the fluorene-based compounds. Herein, Compound 1 may be present in an HTL of an OLED. The organic layer may also include Compound 1 and Compound 2 as the fluorene-based compounds. Herein, Compounds 1 and 2 may exist in the same layer (i.e., Compounds 1 and 2 may exist in an HTL), or on different layers (i.e., Compound 1 may exist in an HTL while Compound 2 may exist in an EML).

The organic layer may further include i) at least one layer selected from among an hole injection layer (HIL), a hole transport layer (HTL), a functional layer having both hole injection and hole transport capabilities at the same time (hereinafter, referred as an "H-functional layer"), a buffer layer, and an electron blocking layer (EBL) disposed between the first electrode and the EML, and ii) at least one layer selected from among a hole blocking layer (HBL), an electron transport layer (ETL), and an electron injection layer (EIL) disposed between the EML and the second electrode.

In some embodiment, the at least one layer disposed between the first electrode and the EML further comprises a charge-generating material.

The fluorene-based compound represented by Formula 1 may exist between the first electrode and the EML in the organic layer.

In some embodiment, the EML comprises an organometallic complex having at least one of Ir, Pt, Os, Ti, Zr, Hf, Eu, Tb, and Tm.

For example, the organic layer may further include an HTL between the first electrode and the EML and the fluorene-based compound may exist in the HTL.

In addition, the organic layer may further include at least one layer selected from among an HIL, an HTL, and an H-functional layer between the first electron and the EML, and at least one of the HIL, the HTL, and the H-functional layer may include the fluorene-based compound.

The term "an organic layer" as used herein may refer to a single layer and/or a multilayer disposed between the first electrode and the second electrode in an OLED.

FIG. 1 is a schematic sectional view illustrating an OLED 10 according to an embodiment of the present invention. Hereinafter, a structure and a method of manufacturing an OLED, according to an embodiment of the present invention with reference to FIG. 1, will be described as follows:

The substrate 11, which may be any substrate used in a general OLED, may be a glass substrate or a transparent plastic substrate with excellent mechanical strength, thermal stability, transparency, surface smoothness, ease of handling, and water resistance.

The first electrode 13 may be formed by providing materials for forming the first electrode on top of the substrate 11 via a deposition method, a sputtering method, or the like. When the first electrode 13 is an anode, the material for forming the first electrode 13 with a high work function may be selected to facilitate hole injection. The first electrode 13 may be a reflective electrode or a transmission electrode. Example of the material for forming the first electrode 13 are indium tin oxide (ITO), indium zinc oxide (IZO), tin oxide (SnO2), zinc oxide (ZnO), and the like, which are transparent and highly conductive. The first electrode 13 may be formed as a reflective electrode from magnesium (Mg), aluminum (Al), aluminum-lithium (Al—Li), calcium (Ca), magnesium-indium (Mg—In), magnesium-silver (Mg—Ag), or the like.

The first electrode 13 may have a single layer structure or a multilayer structure of two or more kinds of layers. For example, the first electrode 13 may have a three-layer structure of ITO/Ag/ITO, but is not limited thereto.

The organic layer 15 may be disposed on top of the first electrode 13.

The organic layer 15 may include an HIL an HTL, a buffer layer, an EML, an ETL, and an EIL.

An HIL may be formed on top of the first electrode 13 by vacuum deposition, spin coating, casting, Langmuir Blodgett (LB) deposition, or the like.

When the HIL is formed using vacuum deposition, the vacuum deposition conditions may vary according to the compound that is used as a material to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 Å/sec to about 100 Å/sec. However, the deposition conditions are not limited thereto.

When the HIL is formed using spin coating, the coating conditions may vary according to the compound that is used as a material to form the HIL, and the desired structure and thermal properties of the HIL to be formed. For example, the coating rate may be in a range of about 2000 rpm to about 5000 rpm, and a temperature at which heat treatment is performed to remove a solvent after coating may be in a range of about 80° C. to about 200° C. However, the coating conditions are not limited thereto.

Alternatively, widely-known HIL materials may also be used. Examples of such HIL materials may be, but are not limited to, N,N'-diphenyl-N,N'-bis-[4-(phenyl-m-tolyl-amino)-phenyl]-biphenyl-4,4'-diamine (DNTPD) and copper phthalocyanine, 4,4',4"-tris(3-methylphenylphenylamino) triphenylamine (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate (PEDOT/PSS), polyaniline/Cemphor sulfonicacid (Pani/CSA), and polyaniline/poly(4-styrenesulfonate) (PANI/PSS):

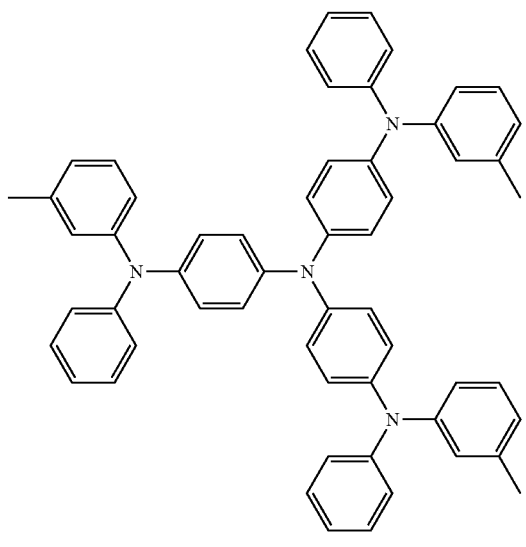

m-MTDATA

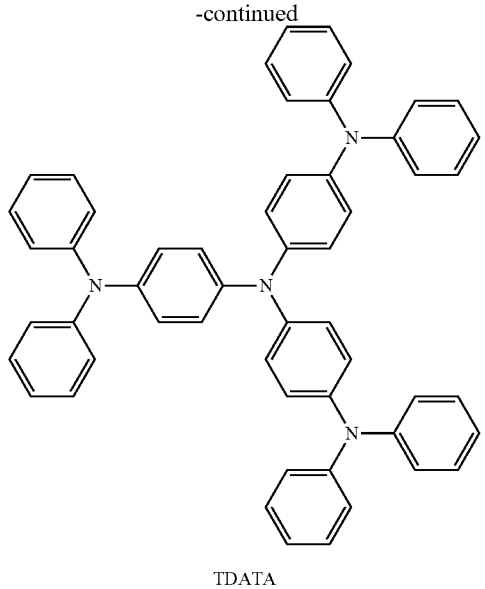

TDATA

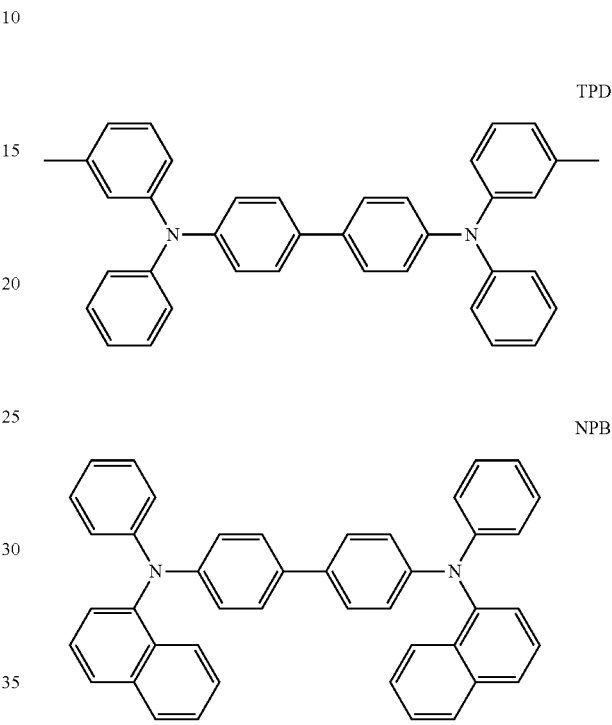

2-TNATA

The HIL may include the fluorene-based compound represented by Formula 1, but the compound is not limited thereto.

A thickness of the HIL may be from about 100 Å to about 10000 Å, and in some embodiments, may be from about 100 Å to about 1000 Å. When the thickness of the HIL is within these ranges, the HIL may have satisfactory hole injecting abilities without a substantial increase in driving voltage.

Then, an HTL may be formed on top of the HIL by using vacuum deposition, spin coating, casting, LB deposition, or the like. When the HTL is formed using vacuum deposition or spin coating, the conditions for deposition and coating may vary according to the material that is used to form the HTL, but the conditions may be similar to those for the formation of the HIL.

The HTL may include the fluorene-based compound represented by Formula 1 as described above.

In addition, Examples of known hole transporting materials my be, but are not limited to, carbazole derivatives such as N-phenylcarbazole and polyvinylcarbazole, N,N'-bis(3-methyphenyl)-N,N'-diphenyl-[1,1-biphenyl]-4,4'-diamine (TPD), and 4,4',4"-tris(N-carbazolyl)triphenylamine (TCTA),N,N'-di(1-naphthyl)-N,N'-diphenylbenzidine (NPB), but are not limited thereto.

A thickness of the HTL may be from about 50 Å to about 2000 Å, and in some embodiments, may be from about 100 Å to about 1500 Å. When the thickness of the HTL is within these ranges, the HTL may have satisfactory hole transporting abilities without a substantial increase in driving voltage.

The H-functional layer (a functional layer having hole injecting function and hole transporting capabilities at the same time) may include at least one of the materials used to form the HIL and the HTL as described above, and a thickness of the H-functional layer may be from about 100 Å to about 10000 Å, and in some embodiments, may be from about 100 Å to about 1000 Å. When the thickness of the H-functional layer is within these ranges, the H-functional layer may have satisfactory abilities of hole injection and hole transport without a substantial increase in driving voltage.

The H-functional layer may include the fluorene-based compound represented by Formula 1, but the compound is not limited thereto.

The organic layer 15 may further include a charge-generating material to improve layer conductivity, in addition to a known hole injecting material, hole transport material, and/or material having both hole injection and hole transport capabilities as described above, between the first electrode and the EML (i.e., between at least one of the HIL, the HTL, and the H-functional layer).

The charge-generating material may be; for example, a p-type dopant. The p-type dopant may be one of quinine derivatives, metal oxides, and compounds with a cyano group, but are not limited thereto. Non-limiting examples of the p-type dopant may be a quinine derivative such as a tetracyanoquinodimethane (TCNQ) and 2,3,5,6-tetrafluoro-tetracyano-1,4-benzoquinondimethane (F4-TCNQ); a metal oxide such as a tungsten oxide and a molybdenum oxide; a compound with a cyano group such as Formula 200 below, but are not limited thereto.

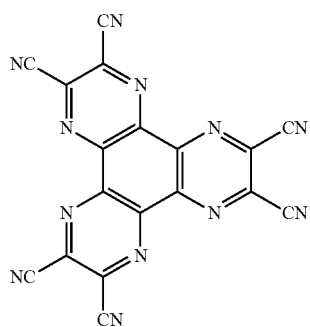

Compound 200

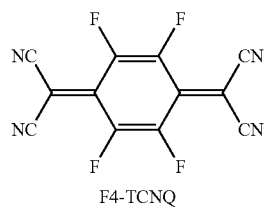

F4-TCNQ

When the organic layer 15 further includes the charge-generating material between the first electrode and the EML (i.e., between at least one of the HIL, HTL, and the H-functional layer), the charge-generating material may be in various modifications, for example, homogeneously dispersed or inhomogeneously dispersed between the first electrode and the EML.

A buffer layer may be disposed between at least one of the HIL, HTL, and H-functional layer, and the EML. The buffer layer may compensate for an optical resonance distance of light according to a wavelength of the light emitted from the EML, and thus may increase efficiency. The buffer layer may include any hole injecting material or hole transporting material that are widely known. In some other embodiments, the buffer layer may include the same material as one of the materials included in the HIL, HTL, and H-functional layer that underlie the buffer layer.

Then, an EML may be formed on top of an HTL, an H-functional layer, or a buffer layer by vacuum deposition, spin coating, casting, LB deposition, or the like. When the EML is formed using vacuum deposition or spin coating, the deposition and conditions may be similar to those for the formation of the HIL, though the conditions for deposition and coating may vary according to the material that is used to form the EML.

The EML may include a host and a dopant. The host may include the fluorene-based compound represented by Formula 1, but the compound is not limited thereto. The dopant may include a fluorescent dopant and/or a phosphorescent dopant. The phosphorescent dopant may be an organometallic complex including Ir, Pt, Os, Ti, Zr, Hf, Eu, Tb, or Tm.

When an OLED is capable of emitting a full color, an EML may be patterned in a red EML, a green EML, and a blue EML. In addition, the EML may have a structure of at least two layers selected from among the red EML, the green EML, and/or the blue EML to emit white light, but the light color is not limited thereto.

Meanwhile, at least one of the red EML, the green EML, and the blue EML may include dopants below (ppy=phenylpyridine).

For example, the compounds below included in the EML may serve as a blue dopant, but are not limited thereto.

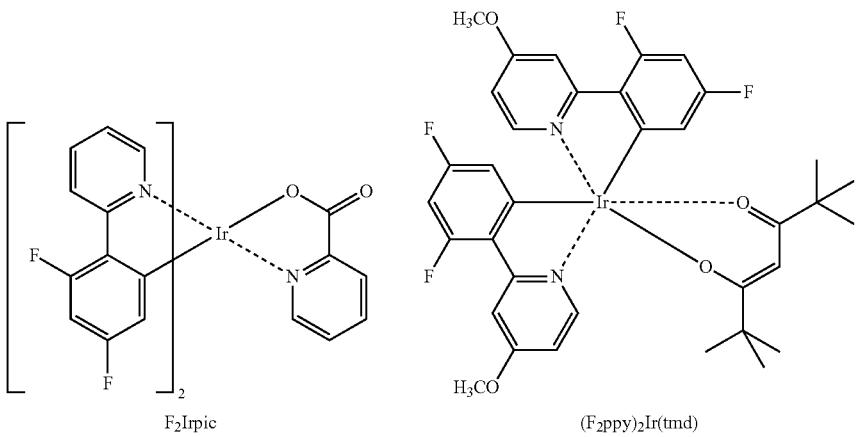

F₂Irpic        (F₂ppy)₂Ir(tmd)

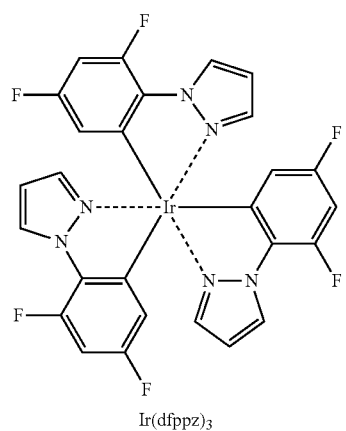
Ir(dfppz)₃
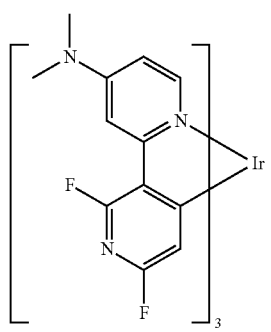 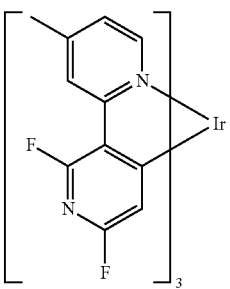 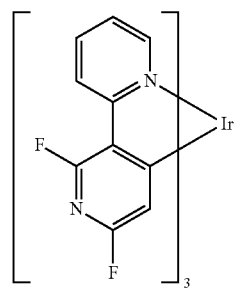
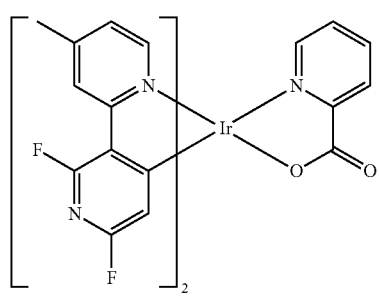 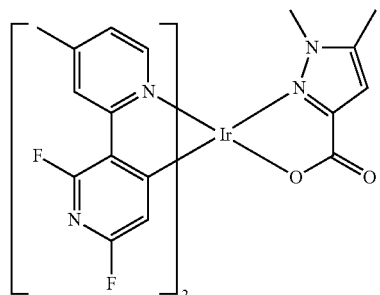 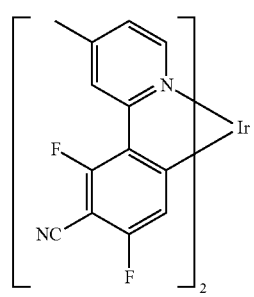
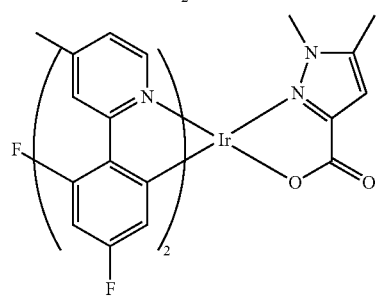 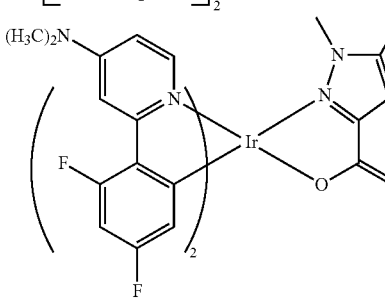 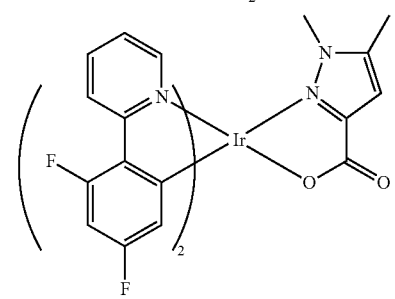
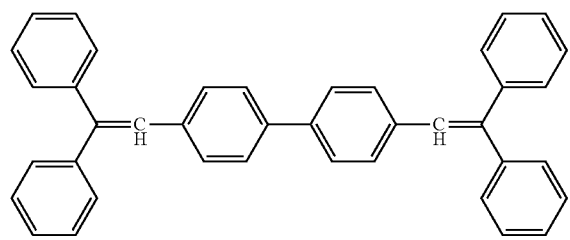
DPVBi
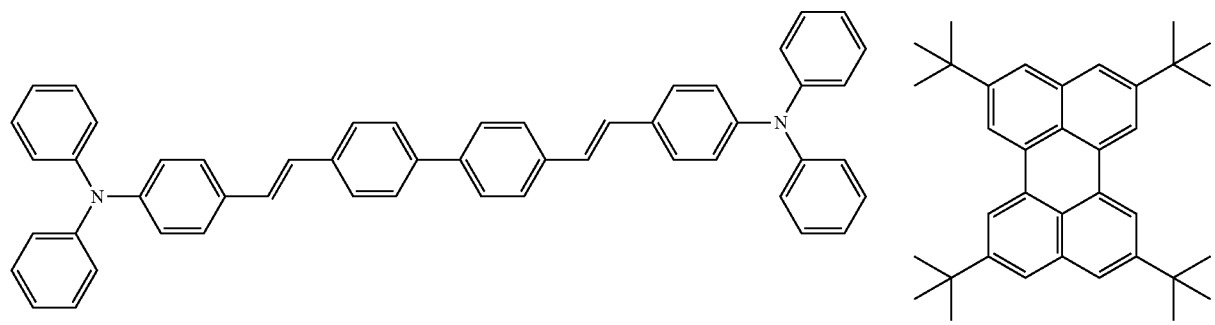
DPAVBi
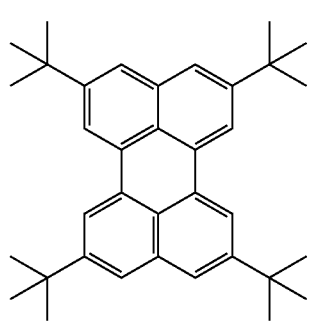
TBPe For example, the compounds below included in the EML may serve as a red dopant, but are not limited thereto. In addition, DCM or DCJTB that will be described later may serve as the red dopant.
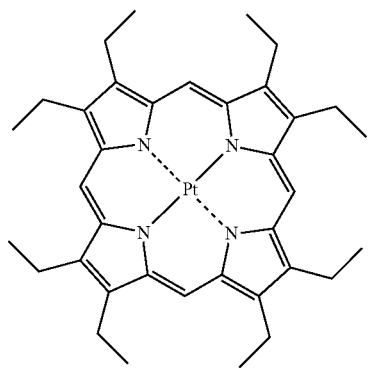
PtOEP
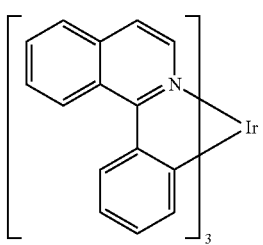
Ir(piq)₃
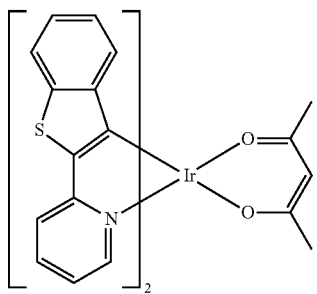
Btp₂Ir(acac)
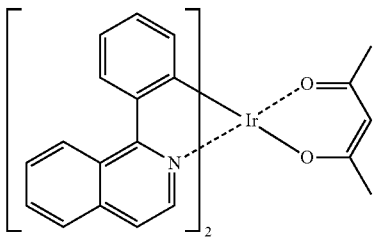
Ir(pq)₂(acac)
-continued
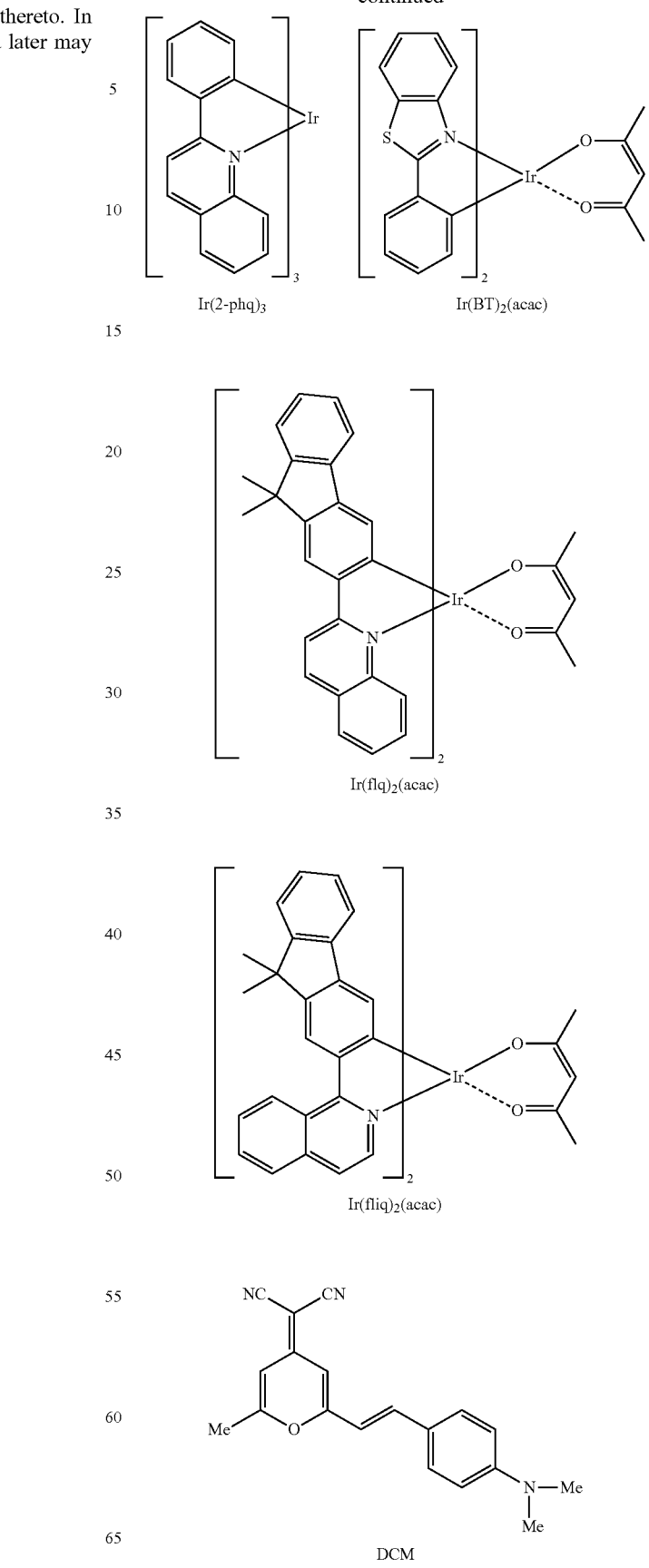
Ir(2-phq)₃
Ir(BT)₂(acac)
Ir(flq)₂(acac)
Ir(fliq)₂(acac)
DCM -continued
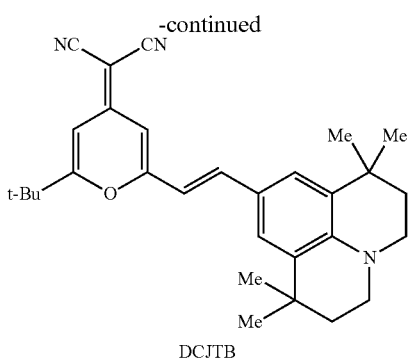
DCJTB
For example, the compounds below included in the EML may serve as a green dopant, but are not limited thereto. In addition, C545T below may serve as the green dopant.
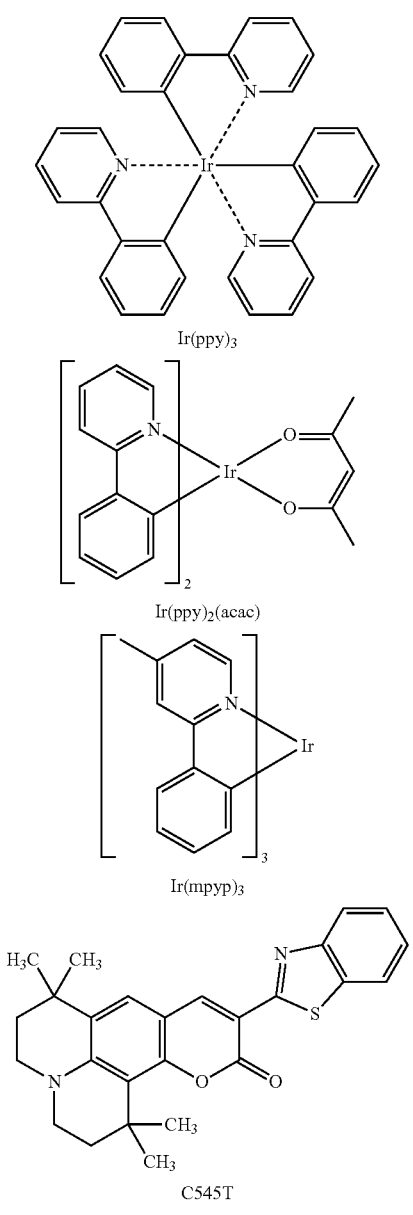
Ir(ppy)₃
Ir(ppy)₂(acac)
Ir(mpyp)₃
C545T
Meanwhile, dopants included in the EML may include a complex as will be described later, but are not limited thereto.
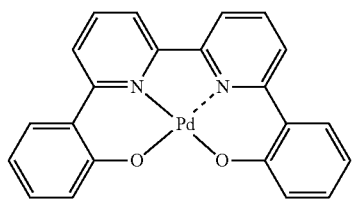
D1
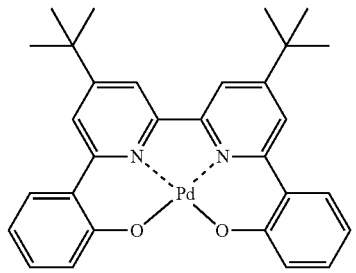
D2
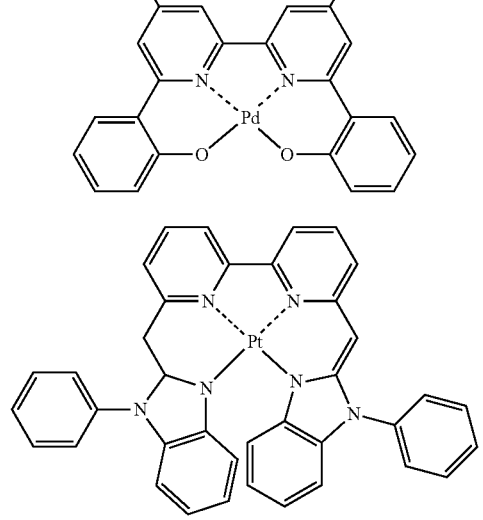
D3
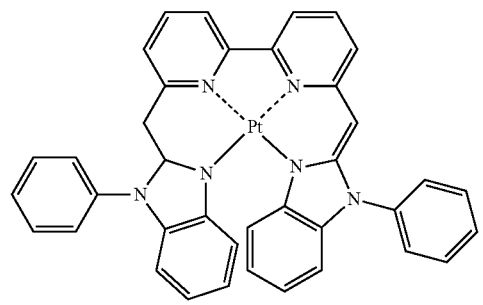
D4
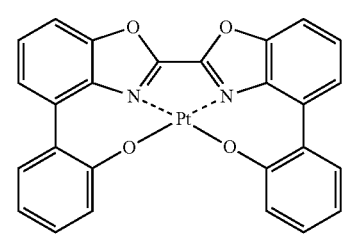
D5
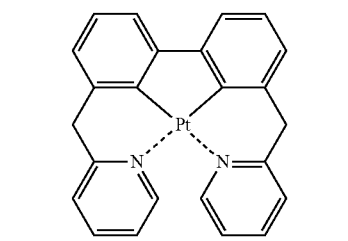
D6

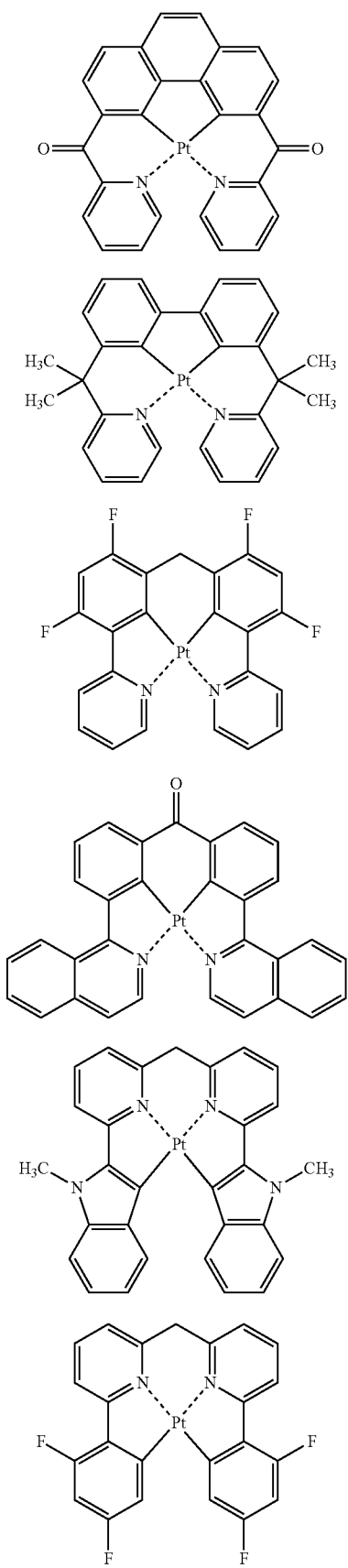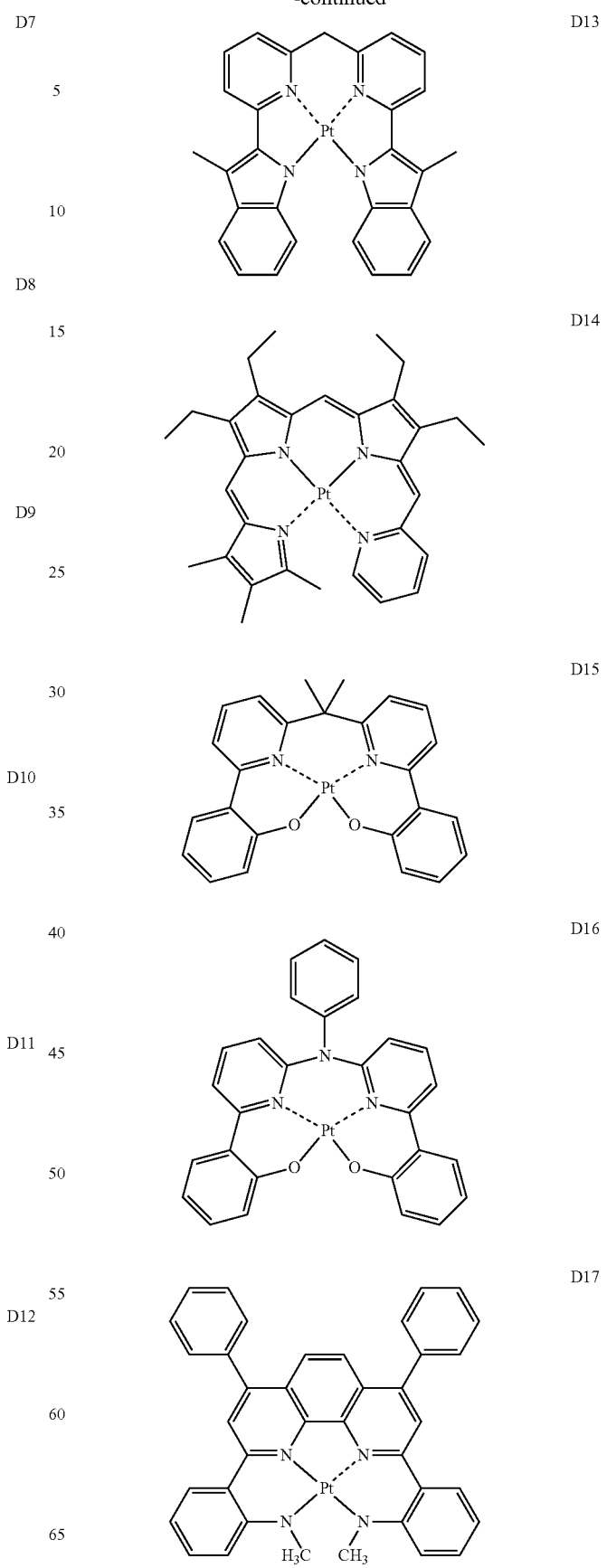

-continued
D18
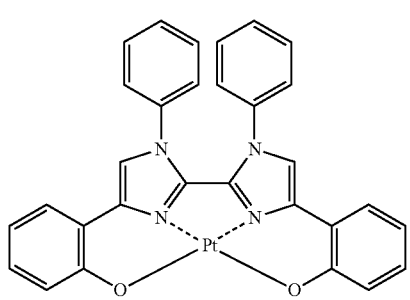
D19
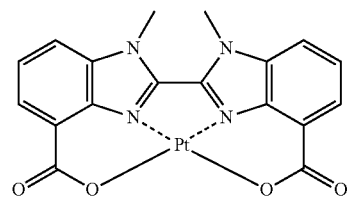
D20
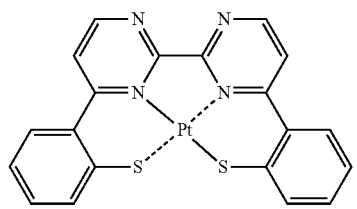
D21
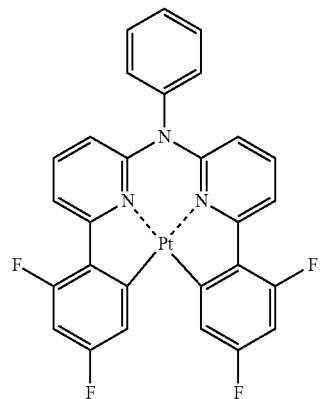
D22
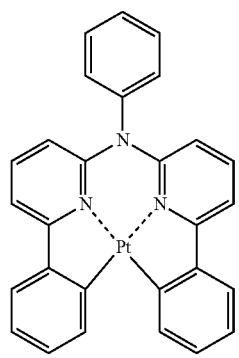
-continued
D23
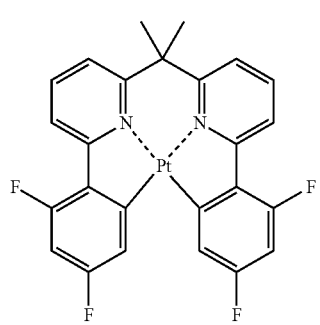
D24
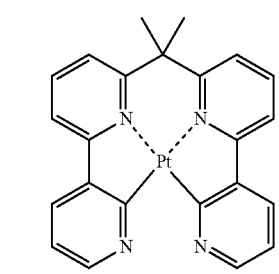
D25
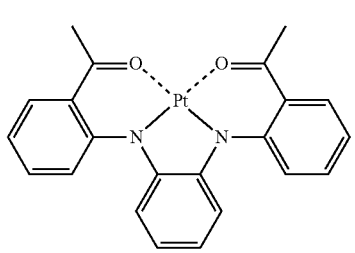
D26
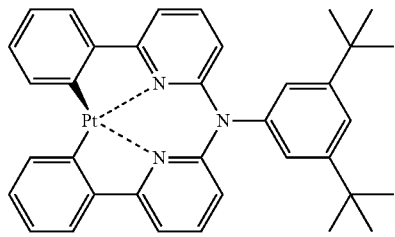
D27
D28

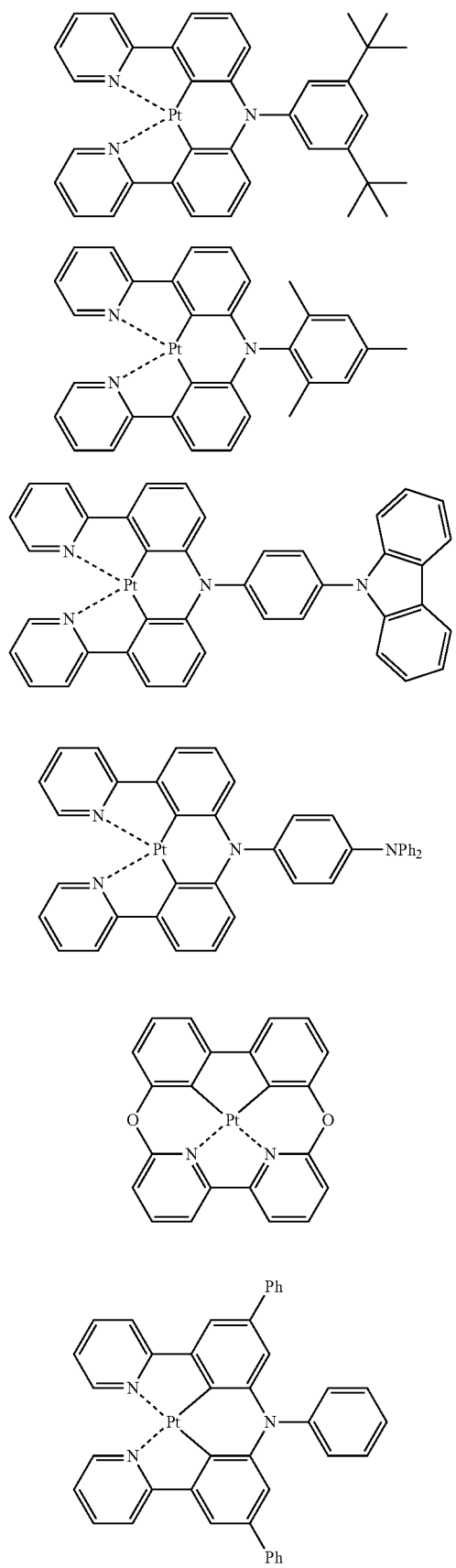

D40 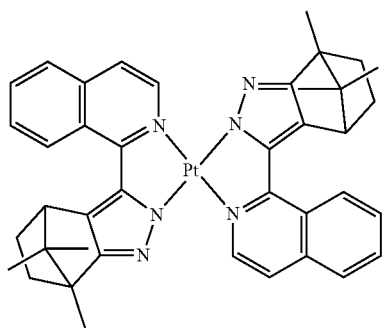
D41 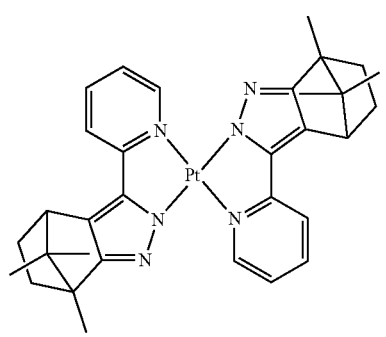
D42 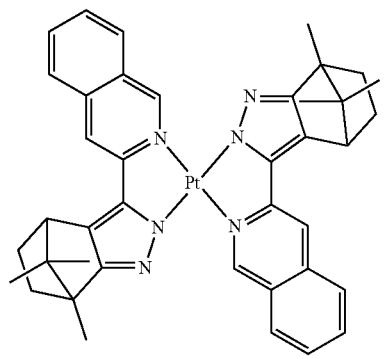
D43 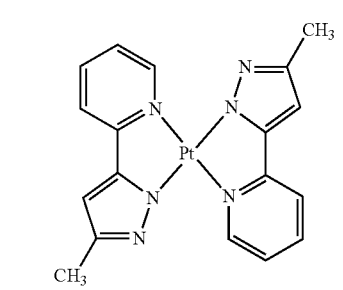
D44 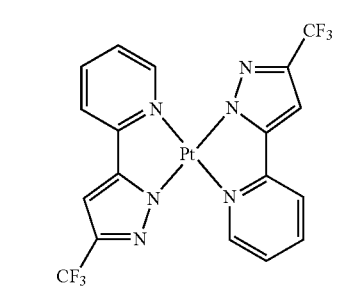
D45 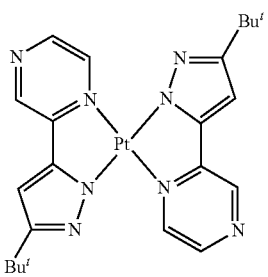
D46 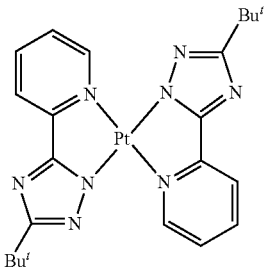
D47 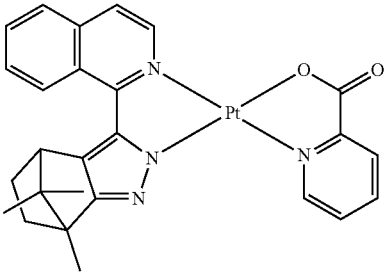
D48 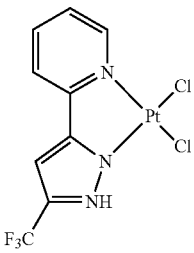
D49 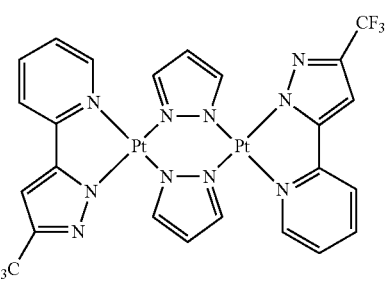

-continued

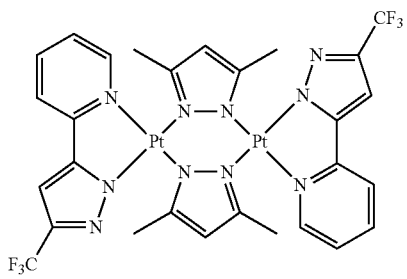

D50

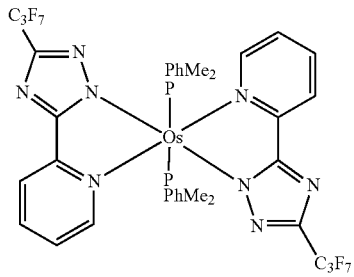

Os(hptz)₂(PPhMe₂)₂

Dopants included in the EML may include an Os-complex as will be described later, but are not limited thereto.

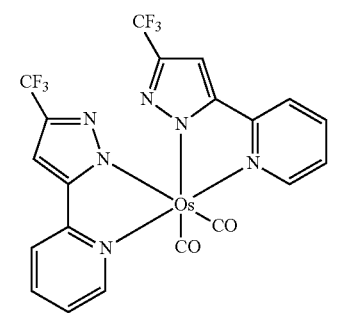

Os(fppz)₂(CO)₂

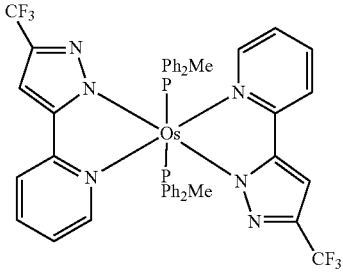

Os(fppz)₂(PPh₂Me)₂

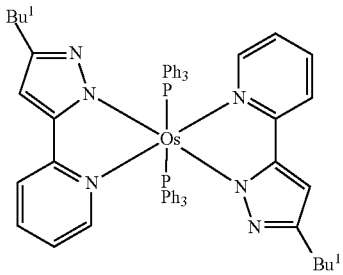

Os(bppz)₂(PPh₃)₂

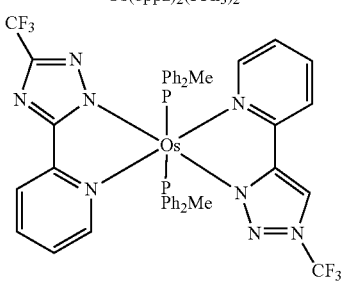

Os(fptz)₂(PPh₃Me)₂

When the EML includes a host and a dopant, an amount of the dopant may be from about 0.01 to about 15 parts by weight based on 100 parts by weight of the host, but is not limited thereto.

A thickness of the EML is about 100 Å to about 1000 Å, and in some embodiments, may be from about 200 Å to about 600 Å. When the thickness of the EML is within these ranges, the EML may have improved light-emitting ability without a substantial increase in driving voltage.

Next, an ETL may be formed on top of the EML using various ways such as vacuum deposition, spin coating, or casting, Langmuir LB deposition. When the ETL is formed using vacuum deposition or spin coating, the deposition and coating conditions may be similar to those used to form the HIL, although the deposition and coating conditions may vary according to a compound that is used to form the ETL.

The materials for forming the ETL function as to stabilize transport of injected electrons injected from a cathode, and may use electron transporting materials. Examples of known electron transporting materials are quinoline derivatives, more particularly, tris(8-quoleate)aluminum (Alq₃), TAZ, Balq, beryllium bis(benzoquinolin-10-olate) (Bebq₂), ADN, Compound 201, and Compound 202, but are not limited thereto.

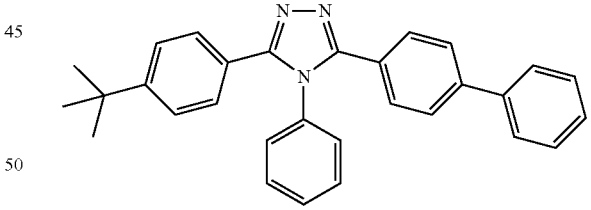

TAZ

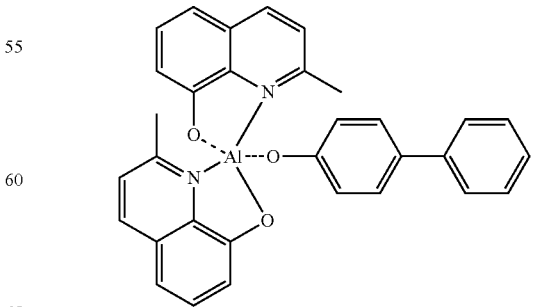

BAlq

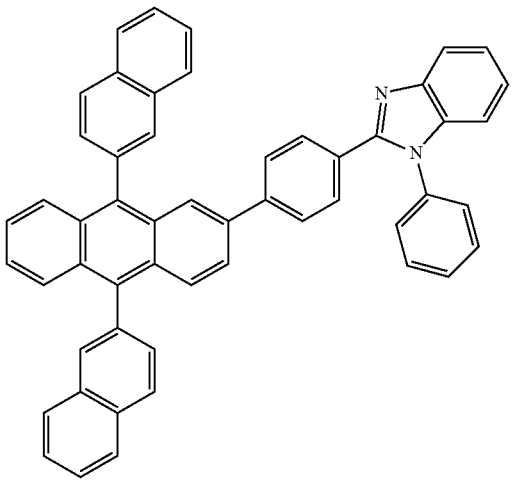

Compound 201

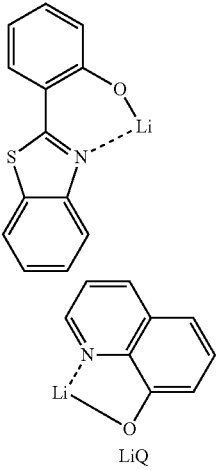

Compound 203

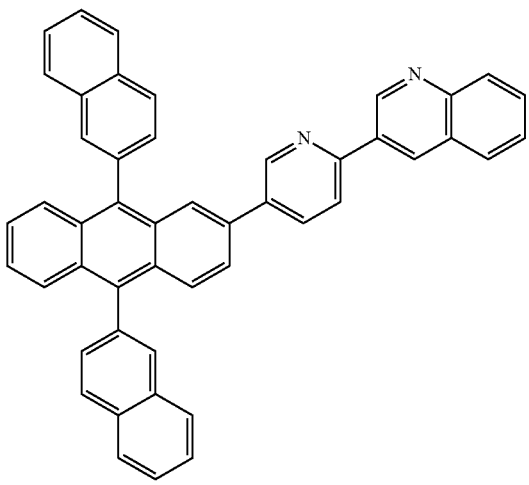

Compound 202

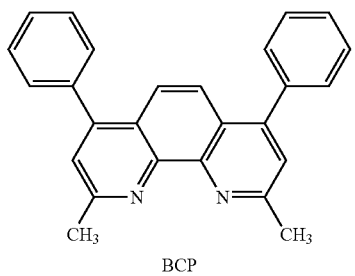

BCP

A thickness of the ETL may be from about 100 Å to about 1000 Å, and in some embodiments, may be from about 150 Å to about 500 Å. When the thickness of the ETL is within these ranges, the ETL may have satisfactory electron transporting ability without a substantial increase in driving voltage.

In addition, the ETL may further include a metal-containing material in addition to a known electron transporting organic compound.

The metal-containing material may include a lithium (Li) complex. Non-limiting examples of the Li complex are lithium quinolate (LiQ) and Compound 203 below:

Also, an EIL, which facilitates injection of electrons from the cathode, may be formed on top of the ETL. Any suitable electron-injecting material may be used to form the EIL.

Examples of materials for forming the EIL may be LiF, NaCl, CsF, $Li_2O$, BaO, and the like, which are known in the art. The deposition condition may be similar to those used to form the HIL, although the deposition condition may vary according to the material that is used to form the EIL.

A thickness of the EIL may be from about 1 Å to about 100 Å, and in some embodiments, may be from about 3 Å to about 90 Å. When the thickness of the ETL is within these ranges, the ETL may have satisfactory electron transporting ability without a substantial increase in driving voltage.

A second electrode 17 is disposed on top of the organic layer 15. The second electrode 17 may be a cathode, which is an electron injecting electrode. Herein, the material for forming the second electrode 17 may be a metal, an alloy, an electrically conducting compound, and a mixture thereof having a low-work function. In this regard, a thin film type transmission electrode may be obtained by using lithium (Li), magnesium (Mg), aluminum (Al), aluminum-lithium (Al—Li), calcium (Ca), magnesium-indium (Mg—In), magnesium-silver (Mg—Ag), or the like. Meanwhile, in some embodiments, the transmission electrode may be formed of in a various modifications such as indium thin oxide (ITO) and indium zinc oxide (IZO).

So far, the OLED is described with reference to FIG. 1, but is not limited thereto.

In addition, when the EML is formed using a phosphorescent dopant, a hole blocking layer (HBL) may be formed between the HTL and the EML or between the H-functional layer and the EML by a method, for example, vacuum deposition, spin coating, casting, LB, or the like to prevent diffusion of triplet excitons or holes toward the ETL. When the HBL is formed using vacuum deposition or spin coating, the conditions for deposition and coating may be similar to those for the formation of the HIL, although the conditions for deposition and coating may vary according to the compound that is used to form the HBL. Any known hole-blocking material may be used. Examples of the HBL are oxadiazole derivatives, triazole derivatives, or phenanthroline derivatives. In particular, BCP below may be used as a hole-blocking material.

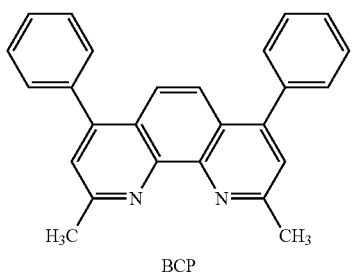

BCP

A thickness of the HBL may be from about 20 Å to about 1000 Å, and in some embodiments, may be from about 30 Å to about 300 Å. When the thickness of the HBL is within these ranges, the HBL may have improved hole blocking ability without a substantial increase in driving voltage.

Examples of the unsubstituted $C_1$-$C_{60}$ alkyl group (or a $C_1$-$C_{60}$ alkyl group) used herein may be linear or branched $C_1$-$C_{60}$ alkyl group such as a methyl group, an ethyl group, a propyl group, an isobutyl group, a sec-butyl group, a pentyl group, an iso-amyl group, a hexyl group, or the like. In the substituted $C_1$-$C_{60}$ alkyl group, at least one hydrogen atom of the unsubstituted $C_1$-$C_{60}$ alkyl group described above is substituted with one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthiogroup, a $C_2$-$C_{60}$ heteroaryl group, a phenyl-$C_2$-$C_{60}$ heteroaryl group, —N($Q_{11}$)($Q_{12}$), and —Si($Q_{13}$)($Q_{14}$)($Q_{15}$) (herein, $Q_{11}$ and $Q_{15}$ may each be independently hydrogen, a $C_1$-$C_{10}$ alkyl group, a $C_6$-$C_{20}$ aryl group, or a $C_2$-$C_{20}$ heteroaryl group).

The unsubstituted $C_1$-$C_{60}$ alkoxy group (or a $C_1$-$C_{60}$ alkoxy group) used herein may have Formula —OA (wherein A is an unsubstituted $C_1$-$C_{60}$ alkyl group described above), and examples are a methoxy, an ethoxy, an isopropyloxy, or the like. At least one hydrogen atom in the alkoxy group may be substituted with the substituent described above in conjunction with the substituted $C_1$-$C_{60}$ alkyl group.

The unsubstituted $C_2$-$C_{60}$ alkenyl group (or the $C_2$-$C_{60}$ alkenyl group) used herein may be a hydrocarbon chain having at least one carbon-carbon double bond in the center or at a terminal of the unsubstituted $C_2$-$C_{60}$ alkyl group. Examples of the unsubstituted $C_2$-$C_{60}$ alkenyl group are an ethenyl group, a prophenyl group, a butenyl group, or the like. At least one hydrogen atom in the unsubstituted $C_2$-$C_{60}$ alkenyl group may be substituted with the substituent described above in conjunction with the substituted $C_1$-$C_{60}$ alkyl group.

The unsubstituted $C_2$-$C_{60}$ alkynyl group (or the $C_2$-$C_{60}$ alkynyl group) used herein may be a hydrocarbon chain having at least one carbon-carbon triple bond in the center or at a terminal of the $C_2$-$C_{60}$ alkyl group. Examples of the unsubstituted $C_2$-$C_{60}$ alkynyl group may be an ethynyl group, a propynyl group, or the like. At least one hydrogen atom in the alkynyl group may be substituted with the substituent described above in conjunction with the substituted $C_1$-$C_{60}$ alkyl group.

The unsubstituted $C_6$-$C_{60}$ aryl group used herein may be a monovalent group having a carbocyclic aromatic system having 6 to 60 carbon atoms including at least one aromatic ring.

The unsubstituted $C_6$-$C_{60}$ arylene group may be a bivalent group having a carbocyclic aromatic system having 6 to 60 carbon atoms including at least one aromatic ring. When the aryl group and the arylene group have at least two rings, the two rings may be fused to each other. At least one hydrogen atom in the aryl group and the arylene group may be substituted with the substituent described above in conjunction with the substituted $C_1$-$C_{60}$ alkyl group.

Examples of the substituted or unsubstituted $C_6$-$C_{60}$ aryl group may be a phenyl group, a $C_1$-$C_{10}$ alkylphenyl group (i.e., an ethylphenyl group), a $C_1$-$C_{10}$ alkylbiphenyl group (i.e., an ethylbiphenyl group), a halophenyl group (i.e., o-, m-, or p-fluorophenyl group, and dichlorophenyl group), a dicyanophenyl group, a trifluoromethoxyphenyl group, o-, m-, or p-tolyl group, o-, m- or p-cumenyl group, a mesityl group, a phenoxyphenyl group, a (α,α-dimethylbenzene)phenyl group, an (N,N'-dimethyl)aminophenyl group, an (N,N'-diphenyl)aminophenyl group, a pentalenyl group, an indenyl group, a naphtyl group, a halonaphtyl group (i.e., a fluoronaphtyl group), a $C_1$-$C_{10}$ alkylnaphtyl group (i.e., a methylnaphtyl group), a $C_1$-$C_{10}$ alkoxynaphtyl group (i.e., a methoxynaphtyl group), an anthracenyl group, an azulenyl group, a heptalenyl group, an acenaphthylenyl group, a phenalenyl group, a fluorenyl group, an anthraquinolyl group, a methylanthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group, or the like. Examples of the substituted $C_6$-$C_{60}$ aryl group may be inferred based on those examples of the unsubstituted $C_6$-$C_{60}$ aryl group and the substituted $C_1$-$C_{60}$ alkyl group described above. Examples of the substituted or unsubstituted $C_6$-$C_{60}$ arylene group may be inferred based on those examples of the substituted or unsubstituted $C_6$-$C_{60}$ aryl group described above.

The unsubstituted $C_2$-$C_{60}$ heteroaryl group used herein may be a monovalent group having at least one aromatic ring having at least one of the heteroatom selected from the group consisting of N, O, S, and P as a ring-forming atom. The unsubstituted $C_2$-$C_{60}$ heteroarylene group may be a divalent group having at least one aromatic ring having at least one of the heteroatoms selected from the group consisting of N, O, P, and S. In this regard, when the heteroaryl group and the heteroarylene group have at least two rings, the two rings may be fused to each other. At least one hydrogen atom in the heteroaryl group and the heteroarylene group may be substituted with the substituent described above in conjunction with the $C_1$-$C_{60}$ alkyl group, Examples of the unsubstituted $C_2$-$C_{60}$ heteroarylene group may be a pyrazolyl group, an imidazolyl group, an oxazolyl group, a thiazolyl group, a triazolyl group, a tetrazolyl group, an oxadiazolyl group, a pyrydinyl group, a pyrydazinyl group, a pyrymidinyl group, a triazinyl group, a carbazolyl group, an indolyl group, a quinolinyl group, an isoquinolinyl group, a benzoimidazolyl group, an imidazopyridinyl group, an imidazopyrymidinyl group, or the like. Examples of the unsubstituted $C_2$-$C_{60}$ heteroarylene group may be inferred based on those examples of the substituted or unsubstituted $C_2$-$C_{60}$ arylene group described above.

The substituted or unsubstituted $C_6$-$C_{60}$ aryloxy group indicates —OA$_2$ (wherein A$_2$ is a substituted or unsubstituted $C_6$-$C_{60}$ arylene group). The substituted or unsubstituted $C_5$-$C_{60}$ arylthio group indicates —SA$_3$ (wherein A$_3$ is a substituted or unsubstituted $C_6$-$C_{60}$ aryl group described above).

The unsubstituted $C_3$-$C_{10}$ cycloalkyl group used herein may represent a carbocyclic alkyl group having 3 to 10 carbon atoms. The unsubstituted $C_2$-$C_{10}$ heterocycloalkyl group, which is a carbocyclic alkyl group having 2 to 10 carbon atoms, may represent a substitutent having at least one of the heteroatoms selected from the group consisting of N, O, S, and P as a ring-forming atom. In addition, the unsubstituted $C_3$-$C_{10}$ cycloalkenyl group used herein may represent a carbocyclic alkenyl group having 3 to 10 carbon atoms. The unsubstituted $C_2$-$C_{10}$ heterocycloalkenyl group, which is a carbocyclic alkenyl group having 2 to 10 carbon atoms, may represent a substitutent having at least one of the heteroatoms selected from the group consisting of N, O, S, and P as a ring-forming atom. At least one hydrogen atom in the $C_3$-$C_{10}$ cycloalkyl group, the $C_2$-$C_{10}$ heterocycloalkyl group, the $C_3$-$C_{10}$ cycloalkenyl group, and the $C_2$-$C_{10}$ heterocycloalkenyl group may be substituted with the substituent described above in conjunction with the $C_1$-$C_{60}$ alkyl group.

One or more embodiments of the present invention will now be described in detail with reference to the following examples. However, these examples are not intended to limit the scope of the one or more embodiments of the present invention.

EXAMPLES

Synthesis Example 1: Synthesis of Compound 1

Synthesis of Intermediate

Reaction Scheme 1-1

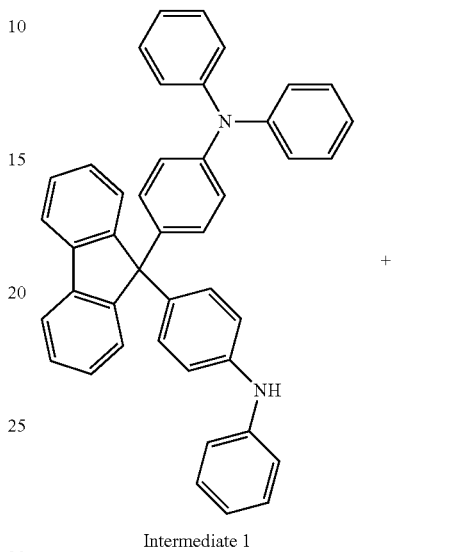

Intermediate 1

Following melting 4.76 g (10 mmol) of 9,9-bis(4-bromophenyl)fluorene, 2.8 g (30 mmol) of aniline, 550 mg (0.6 mmol) of $Pd_2(dba)_3$, 240 mg (1.2 mmol) of P(t-Bu)$_3$, and 3.36 g (35 mmol) of t-BuONa in toluene, the mixture was stirred at 85° C. for about 5 hours. The resulting reaction mixture was cooled down to room temperature, and then extracted with distilled water and ethyl acetate three times to obtain an organic layer. After drying the organic layer by using magnesium sulfate, the solvent was removed. The resulting residues were separated and purified using Silicagel tube column chromatography to obtain Intermediate 1.

Synthesis of Compound 1

Reaction Scheme 1-2

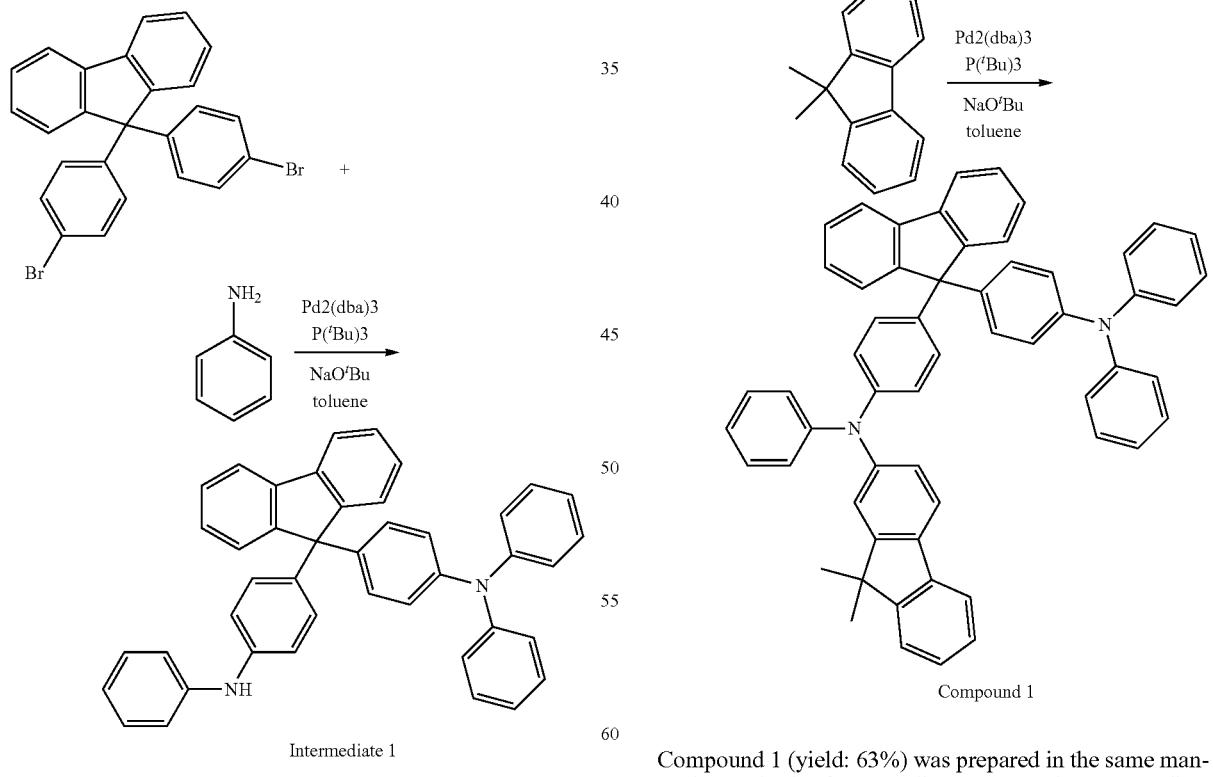

Compound 1

Compound 1 (yield: 63%) was prepared in the same manner as in Synthesis of Intermediate 1, except that Intermediate 1 and 2-bromo-9,9-dimethyl-9H-fluorene were used instead of 9,9-bis(4-bromophenyl)fluorene and aniline, respectively. Then, Compound 1 was purified with a purity of HPLC 99.8% using a sublimation purification apparatus. The results of the NMR analysis of Compound 1 are as follows:

$^1$H NMR (CDCl$_3$), 300 MHz) δ (ppm) 7.92 (3H), 7.78 (3H), 7.68 (1H), 7.38 (3H), 7.32 (2H), 7.28-2.21 (9H), 6.91 (3H), 6.82 (5H), 6.65-6.59 (6H), 6.51 (3H), 1.75 (6H)

Synthesis 2: Synthesis of Compound 2

Synthesis of Intermediate 2

Reaction Scheme 2-1

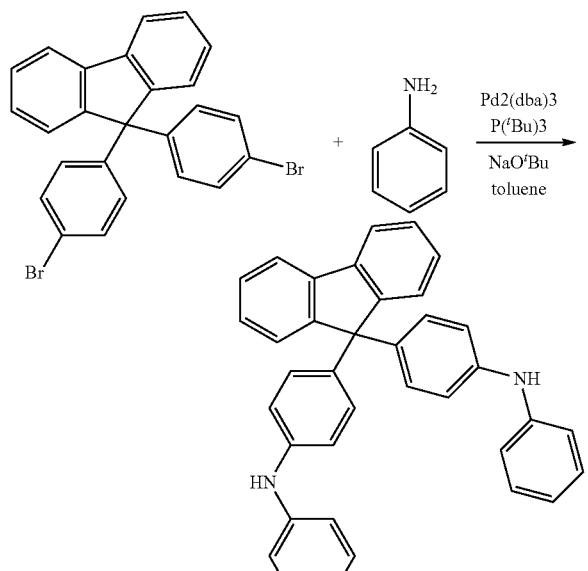

Intermediate 2

Following melting 4.76 g (10 mmol) of 9,9-bis(4-bromophenyl)fluorene, 1.96 g (21 mmol) of aniline, 366 mg (0.4 mmol) of Pd$_2$(dba)$_3$, 160 mg (0.8 mmol) of P(t-Bu)$_3$, and 2.11 g (22 mmol) of t-BuONa in toluene, the mixture was stirred at 85° C. for about 4 hours. The resulting reaction mixture was coiled down to room temperature, and then extracted with distilled water and ethyl acetate three times to obtain an organic layer. After drying the organic layer by using magnesium sulfate, the solvent was removed. The resulting residues were separated and purified using Silicagel tube column chromatography to obtain Intermediate 2.

Synthesis of Compound 2

Reaction Scheme 2-2

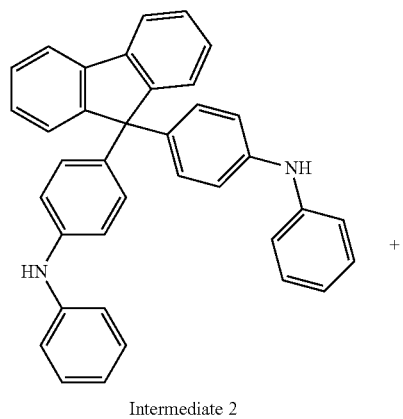

Intermediate 2

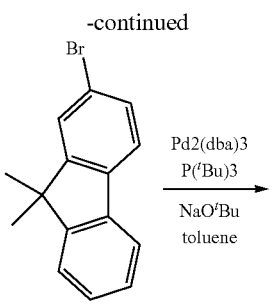

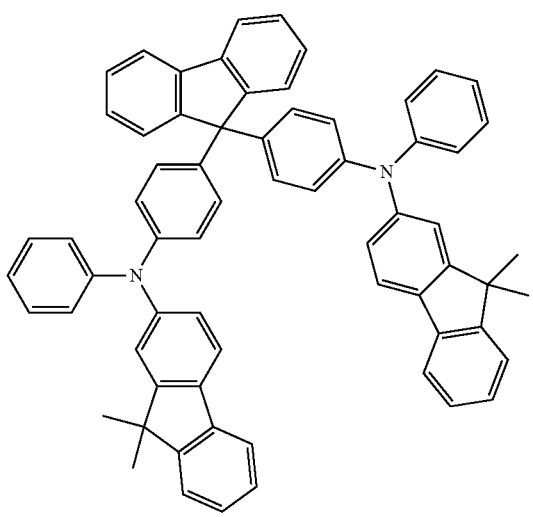

Compound 2

Compound 2 (yield: 71%) was prepared in the same manner as in Synthesis of Intermediate 1, except that Intermediate 2 and 2-bromo-9,9-dimethyl-9H-fluorene were used instead of 9,9-bis(4-bromophenyl)fluorene and aniline, respectively. Then, Compound 2 was purified with a purity of HPLC 99.8% using a sublimation purification apparatus. The results of the NMR analysis of Compound 2 are as follows:

$^1$H NMR (CDCl$_3$, 300 MHz) δ (ppm) 7.93 (4H), 7.72 (2H), 7.68 (4H), 7.38 (4H), 7.26-7.20 (8H), 6.85 (2H), 6.79-6.72 (4H), 6.68-6.61 (6H), 6.59-6.52 (6H), 1.75 (12H)

Synthesis Example 3: Synthesis of Compound 21

Synthesis of Intermediate 21

Reaction Scheme 3-1

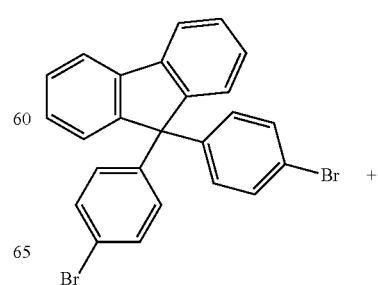

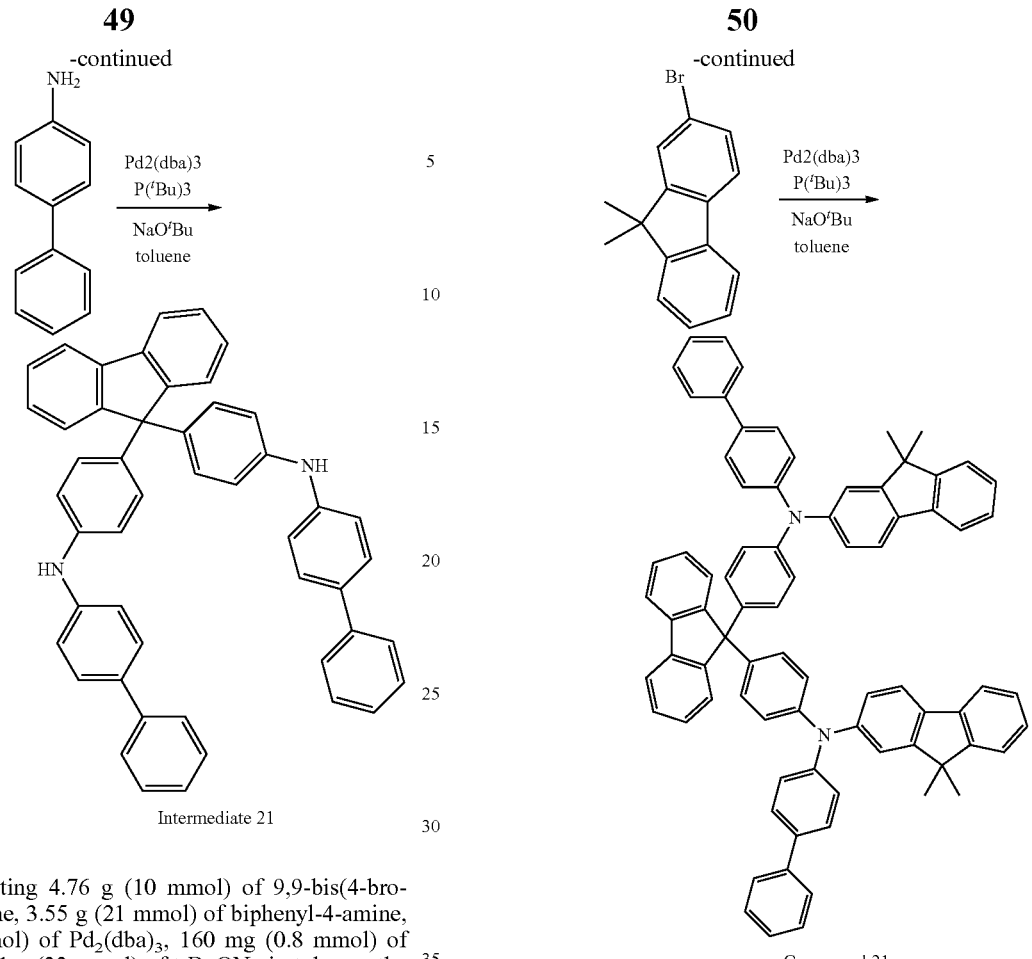

Compound 21

Following melting 4.76 g (10 mmol) of 9,9-bis(4-bromophenyl)fluorene, 3.55 g (21 mmol) of biphenyl-4-amine, 366 mg (0.4 mmol) of $Pd_2(dba)_3$, 160 mg (0.8 mmol) of P(t-Bu)$_3$, and 2.11 g (22 mmol) of t-BuONa in toluene, the mixture stirred at 85° C. for about 4 hours. The resulting reaction mixture was cooled down to room temperature, and then extracted with distilled water and ethyl acetate three times to obtain an organic layer. After drying the organic layer by using magnesium sulfate, the solvent was removed. The resulting residues were separated and purified using Silicagel tube column chromatography to obtain Intermediate 21.

Synthesis of Compound 21

Reaction Scheme 3-2

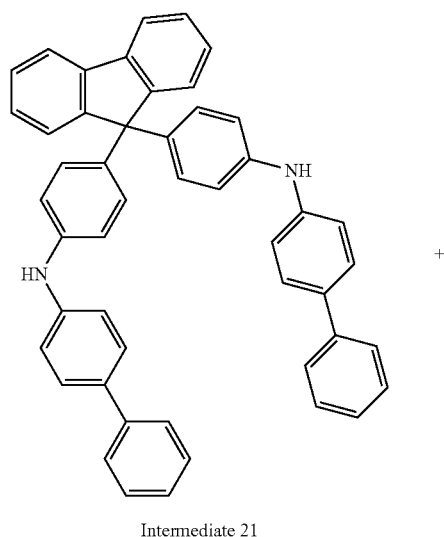

Intermediate 21

Compound 21 (yield: 65%) wad prepared in the same manner as in Synthesis of Intermediate 1, except that Intermediate 21 and 2-bromo-9,9-dimethyl-9H-fluorene were used instead of 9,9-bis(4-bromophenyl)fluorene and aniline, respectively. Then, Compound 21 was purified with a purity of HPLC 99.8% using a sublimation purification apparatus. The results of the NMR analysis of Compound 21 are as follows:

$^1$H NMR (CDCl$_3$, 300 MHz) δ (ppm) 7.93 (4H), 7.74 (4H), 7.62-7.56 (16H), 7.43 (4H), 7.39 (2H), 7.26-6.93 (10H), 6.83 (4H), 6.85-6.81 (4H), 1.75 (12H)

Example 1

As an anode, 15 Ω/cm$^2$ (1200 Å) ITO glass substrate was cut into a size of 50 mm×50 mm×0.7 mm, followed by ultrasonic cleaning each piece of the substrate for about 5 minutes using isopropyl alcohol and pure water. Following UV irradiation for about 30 minutes and exposure to ozone for cleaning, the glass substrate was loaded into a vacuum deposition device.

After 2-TNATA was deposited on the anode to form an HIL having a thickness of about 600 Å, Compound 1 was deposited on the HIL to form an HTL having a thickness of about 300 Å.

Next, Alq$_3$ (host) and C545T (blue fluorescent dopant) was co-deposited on the HTL in a weight ratio of 98:2 to form an EML having a thickness about 300 Å.

Then, the Alq$_3$ was deposited on the EML to form an ETL having a thickness of about 300 Å, and LiF was deposited on the ETL to form an EIL having a thickness of about 10 Å. Next, Al was deposited on the EIL to form a cathode having a thickness of about 3000 Å to manufacture an OLED.

Example 2

An OLED was manufactured in the same manner as in Example 1, except that Compound 2 was used instead of Compound 1 to form the HTL.

Example 3

An OLED was manufactured in the same manner as in Example 1, except that Compound 21 was used instead of Compound 1 to form the HTL.

Comparative Example 1

An OLED was manufactured in the same manner as in Example 1, except that NPB was used instead of Compound 1 to form the HTL.

Comparative Example 2

An OLED was manufactured in the same manner as in Example 1, except that Compound A was used instead of Compound 1 to form the HTL.

Compound A

Comparative Example 3

An OLED was manufactured in the same manner as in Example 1, except that Compound B was used instead of Compound 1 to form the HTL.

Compound B

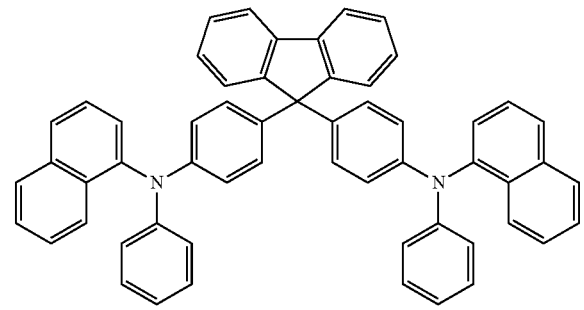

Comparative Example 4

An OLED was manufactured in the same manner as in Example 1, except that Compound C was used instead of Compound 1 to form the HTL.

Compound C

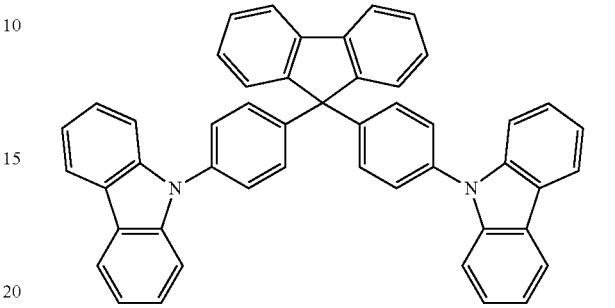

Comparative Example 5

An OLED was manufactured in the same manner as in Example 1, except that Compound D was used instead of Compound 1 to form the HTL.

Compound D

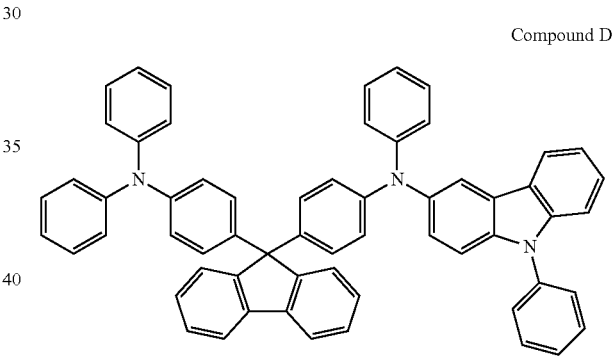

Evaluation Example 1

Driving voltages, efficiencies, color purities of OLEDs from Examples 1 to 3 and Comparative Examples 1 to 5 were evaluated, and the results are shown in Table 1.

Color coordinates: Power supply from current-voltmeter (Kethley SMU 236) and measurement by using luminance meter PR650.

Efficiency: Power supply from current-voltmeter (Kethley SMU 236) and measurement by using luminance meter PR650.

TABLE 1

| | HTL-forming material | Driving voltage (V) | Efficiency (cd/A) | Color coordinates |
|---|---|---|---|---|
| Example 1 | Compound 1 | 6.1 | 16.2 | (0.310, 0.644) |
| Example 2 | Compound 2 | 6.4 | 17.1 | (0.310, 0.643) |
| Example 3 | Compound 21 | 6.3 | 18.4 | (0.309, 0.643) |
| Comparative Example 1 | NPB | 7.4 | 11.9 | (0.308, 0.644) |

TABLE 1-continued

| | HTL-forming material | Driving voltage (V) | Efficiency (cd/A) | Color coordinates |
|---|---|---|---|---|
| Comparative Example 2 | Compound A | 8.7 | 8.1 | (0.310, 0.642) |
| Comparative Example 3 | Compound B | 7.3 | 13.2 | (0.309, 0.643) |
| Comparative Example 4 | Compound C | 7.1 | 11.4 | (0.309, 0.643) |
| Comparative Example 5 | Compound D | 7.8 | 12.6 | (0.308, 0.642) |

Based on Table 1, it was confirmed that OLEDs from Examples 1 to 3 have excellent driving voltages, efficiencies, and color purities in comparison with OLEDs from Comparative Examples 1 to 5.

As described above, according to the one or more embodiments of the present invention, an OLED including the fluorene-based compound may have a low driving voltage and high quality such as high efficiency, high color purity, and a long life.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A fluorene-based compound represented by Formula 1 below:

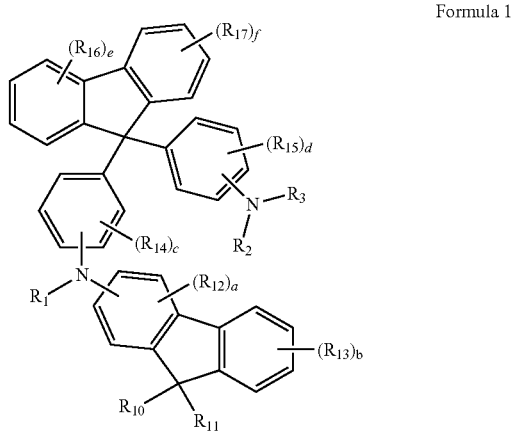

Formula 1 wherein $R_1$ to $R_3$ are each independently selected from a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{30}$ aryl group, and a substituted or unsubstituted $C_2$-$C_{30}$ heteroaryl group, and $R_2$ and $R_3$ are optionally connected to each other by a single bond, —O—, —S—, a substituted or unsubstituted $C_1$-$C_5$ alkylene group, or a substituted or unsubstituted $C_2$-$C_5$ alkenylene group;

$R_{10}$ to $R_{17}$ are each independently selected from hydrogen, deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ heterocycloalkyl group, a substituted or unsubstituted $C_2$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthiogroup, a substituted or unsubstituted $C_2$-$C_{60}$ heteroaryl group, —N($Q_1$)($Q_2$), and —Si($Q_3$)($Q_4$)($Q_5$), and $Q_1$ to $Q_5$ are each independently selected from hydrogen, deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthiogroup, and a substituted or unsubstituted $C_2$-$C_{60}$ heteroaryl group;

a, c, and d are each independently an integer between 1 to 3; and b, e, and f are each independently an integer between 1 to 4.

2. The fluorene-based compound according to claim 1, wherein $R_1$ to $R_3$ are each independently selected from a cyclopropyl group, a cyclobutyl group, a cyclopentyl group, a cyclohexyl group, a cycloheptyl group, a cyclooctyl group, a cyclopentenyl group, a cyclopentadienyl group, a cyclohexenyl group, a cyclohexadienyl group, a cycloheptadienyl group, a thiophenyl group, a furanyl group, a pyrrolyl group, an imidazolyl group, a pyrazolyl group, an isothiazolyl group, an isoxazole group, a thiazolyl group, an oxazolyl group, an oxadiazolyl group, a thiadiazolyl group, a triazolyl group, a phenyl group, a pyrydinyl group, a pyrazinyl group, a pyrymidinyl group, a pyrydazinyl group, a triazinyl group, a pentalenyl group, an indenyl group, a naphtyl group, an azulenyl group, a heptalenyl group, a biphenyl group, an indacenyl group, an acenaphthylenyl group, a fluorenyl group, a spirofluorenyl group, a carbazolyl group, an anthryl group, a phenalenyl group, a phenanthrenyl group, a pherylenyl group, a fluoranthenyl group, a naphtalsenyl group, a picenyl group, a pentaphenyl group, a hexacenyl group, a dibenzofuranyl group, a dibenzotiophenyl group, a phenothiazinyl group, a phenoxazinyl group, a dihydrophenazinyl group, a phenoxathinyl group, and a phenanthridinyl group; and a cyclopropyl group, a cyclobutyl group, a cyclopentyl group, a cyclohexyl group, a cycloheptyl group, a cyclooctyl group, a cyclopentenyl group, a cyclopentadienyl group, a cyclohexenyl group, a cyclohexadienyl group, a cycloheptadienyl group, a thiophenyl group, a furanyl group, a pyrrolyl group, an imidazolyl group, a pyrazolyl group, an isothiazolyl group, an isoxazole group, a thiazolyl group, an oxazolyl group, an oxadiazolyl group, a thiadiazolyl group, a triazolyl group, a phenyl group, a pyrydinyl group, a pyrazinyl group, a pyrymidinyl group, a pyrydazinyl group, a triazinyl group, a pentalenyl group, an indenyl group, a naphtyl group, an azulenyl group, a heptalenyl group, a biphenyl group, an indacenyl group, an acenaphthylenyl group, a fluorenyl group, a spirofluorenyl group, a carbazolyl group, an anthryl group, a phenalenyl group, a phenanthrenyl group, a pherylenyl group, a fluoranthenyl group, a naphtalsenyl group, a picenyl group, a pentaphenyl group, a hexacenyl group, a dibenzofuranyl group, a dibenzotiophenyl group, a phenothiazinyl group, a phenoxazinyl group, a dihydrophenazinyl group, a phenoxathinyl group, and a phenanthridinyl group, substituted with at least one of deuterium, a halogen atom, a hydroxyl group, a cyano group, a nitro group, an amino group, an amidino group, hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthiogroup, a $C_2$-$C_{60}$ heteroaryl group, a phenyl-$C_2$-$C_{60}$ heteroaryl group, and —N($Q_{11}$)($Q_{12}$) (herein, $Q_{11}$ and $Q_{12}$ are each independently hydrogen, a $C_1$-$C_{10}$ alkyl group, a $C_6$-$C_{20}$ aryl group, or a $C_2$-$C_{20}$ heteroaryl group).

3. The fluorene-based compound according to claim 1, wherein $R_1$ to $R_3$ are each independently selected from a phenyl group, a pyrydinyl group, a pyrazinyl group, a pyrymidinyl group, a pyrydazinyl group, a triazinyl group, a naphtyl group, a fluorenyl group, a spirofluorenyl group, a carbazolyl group, an anthryl group, a phenalenyl group, and a phenanthrenyl group; and a phenyl group, a pyrydinyl group, a pyrazinyl group, a pyrymidinyl group, a pyrydazinyl group, a triazinyl group, a naphtyl group, a fluorenyl group, a spirofluorenyl group, a carrbazolyl group, an anthryl group, a phenalenyl group, and a phenanthrenyl group, substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphtyl group, an anthryl group, a phenyl-carbazolyl group, a pyrydinyl group, a pyrimidinyl group, and a pyrazinyl group.

4. The fluorene-based compound according to claim 1, wherein $R_1$ to $R_3$ are each independently selected from a phenyl group; a dimethylfluorenyl group; a biphenyl group; a naphtyl group; a phenyl-carbazolyl group; a phenyl group substituted with a phenyl-carbazolyl group, and an anthryl group.

5. The fluorene-based compound according to claim 1, wherein $R_2$ and $R_3$ are connected to each other by a single bond.

6. The fluorene-based compound according to claim 1, wherein $R_{10}$ and $R_{11}$ are each independently selected from a $C_1$-$C_{60}$ alkyl group and a $C_6$-$C_{14}$ aryl group; and a $C_1$-$C_{60}$ alkyl group and a $C_6$-$C_{14}$ aryl group, substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphtyl group, and an anthryl group.

7. The fluorene-based compound according to claim 1, wherein $R_{10}$ and $R_{11}$ are each independently selected from a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonenyl group, an isononenyl group, a sec-nonenyl group, a tert-nonenyl group, an n-decanyl group, an isodecanyl group, a sec-decanyl group, a tert-decanyl group;

a phenyl group, a naphtyl group, and an anthryl group; and a phenyl group, a naphtyl group, and an anthryl group, substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonenyl group, an isononenyl group, a sec-nonenyl group, a tert-nonenyl group, an n-decanyl group, an isodecanyl group, a sec-decanyl group, a tert-decanyl group, a phenyl group, a naphtyl group, and an anthryl group.

8. The fluorene-based compound according to claim 1, wherein $R_{10}$ and $R_{11}$ are connected to each other by a single bond.

9. The fluorene-based compound according to claim 1, wherein $R_{12}$ to $R_{17}$ are each independently selected from hydrogen, deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonenyl group, an isononenyl group, a sec-nonenyl group, a tert-nonenyl group, an n-decanyl group, an isodecanyl group, a sec-decanyl group, a tert-decanyl group, a phenyl group, a naphtyl group, and an anthryl group.

10. The fluorene-based compound according to claim 1, wherein $R_{12}$ to $R_{17}$ are hydrogen atoms.

11. The fluorene-based compound according to claim 1, wherein the fluorene-based compound is represented by Formula 1A:

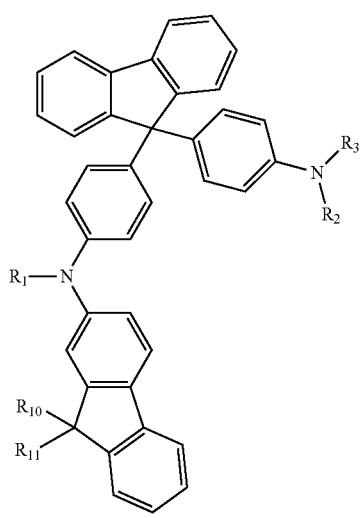

Formula 1A wherein $R_1$ to $R_3$ are each independently selected from a phenyl group, a pyrydinyl group, a pyrazinyl group, a pyrymidinyl group, a pyrydazinyl group, a triazinyl group, a naphtyl group, a fluorenyl group, a spirofluorenyl group, a carbazolyl group, an anthryl group, a phenalenyl group, and a phenanthrenyl group; and a phenyl group, a pyrydinyl group, a pyrazinyl group, a pyrymidinyl group, a pyrydazinyl group, a triazinyl group, a naphtyl group, a fluorenyl group, a spirofluorenyl group, a carbazolyl group, an anthryl group, a phenalenyl group, and a phenanthrenyl group, substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphtyl group, an anthryl group, a phenyl-carbazolyl group, a pyrydinyl group, a pyrymidinyl group, and a pyrazinyl group;

$R_{10}$ and $R_{11}$ are each selected from a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonenyl group, an isononenyl group, a sec-nonenyl group, a tert-nonenyl group, an n-decanyl group, an isodecanyl group, a sec-decanyl group, a tert-decanyl group;

a phenyl group, a naphtyl group, and an anthryl group; and a phenyl group, a naphtyl group, and an anthryl group, substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonenyl group, an isononenyl group, a sec-nonenyl group, a tert-nonenyl group, an n-decanyl group, an isodecanyl group, a sec-decanyl group, a tert-decanyl group, a phenyl group, a naphtyl group, and an anthryl group.

12. The fluorene-based compound according to claim 1, wherein the fluorene-based compound is represented by Formula 1B:

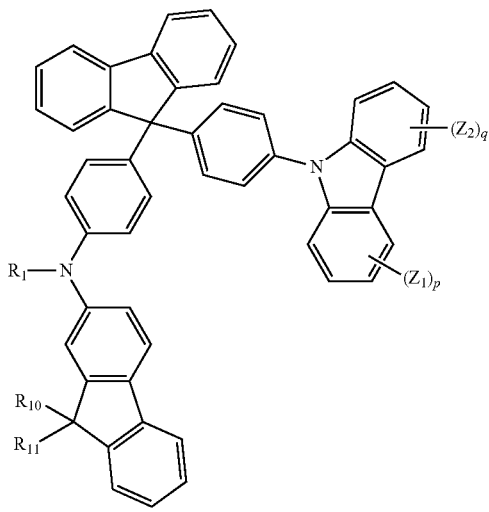

Formula 1B wherein $R_1$ is selected from a phenyl group, a pyrydinyl group, a pyrazinyl group, a pyrymidinyl group, a pyrydazinyl group, a triazinyl group, a naphtyl group, a fluorenyl group, a spirofluorenyl group, a carbazolyl group, an anthryl group, a phenalenyl group, and a phenanthrenyl group; and a phenyl group, a pyrydinyl group, a pyrazinyl group, a pyrymidinyl group, a pyrydazinyl group, a triazinyl group, a naphtyl group, a fluorenyl group, a spirofluorenyl group, a carbazolyl group, an anthryl group, a phenalenyl group, and a phenanthrenyl group, substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphtyl group, an anthryl group a phenyl-carbazolyl group, a pyrydinyl group, a pyrymidinyl group, and a pyrazinyl group;

$Z_1$ and $Z_2$ are each independently selected from hydrogen, deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphtyl group, and an anthryl group;

p and q are each independently an integer between 1 to 4;

$R_{10}$ and $R_{11}$ are each independently selected from a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonenyl group, an isononenyl group, a sec-nonenyl group, a tert-nonenyl group, an n-decanyl group, an isodecanyl group, a sec-decanyl group, a tert-decanyl group;

a phenyl group, a naphtyl group, and an anthryl group; and a phenyl group, a naphtyl group, and an anthryl group, substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonenyl group, an isononenyl group, a sec-nonenyl group, a tert-nonenyl group, an n-decanyl group, an isodecanyl group, a sec-decanyl group, a tert-decanyl group, a phenyl group, a naphtyl group, and an anthryl group.

13. The fluorene-based compound according to claim 1, being one of Compounds 1 to 23:

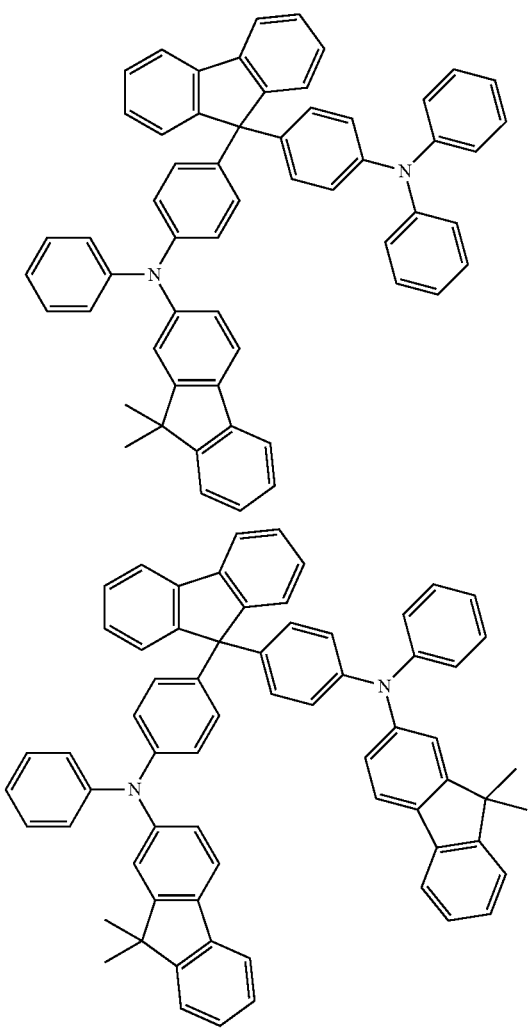

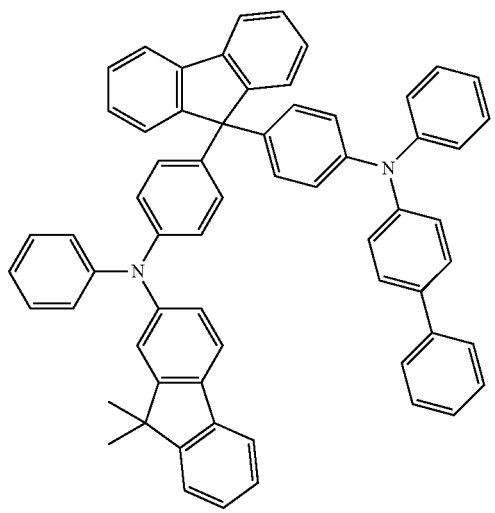

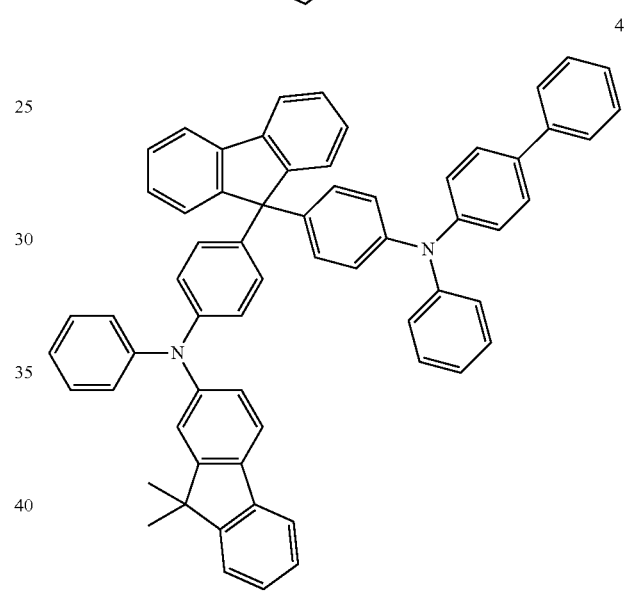

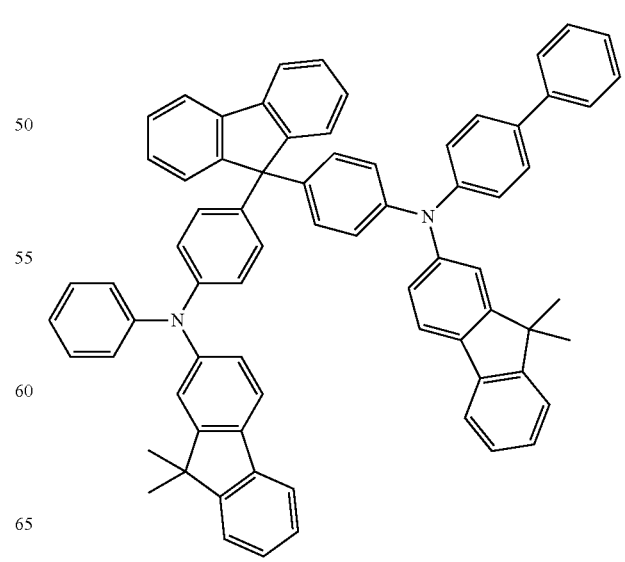

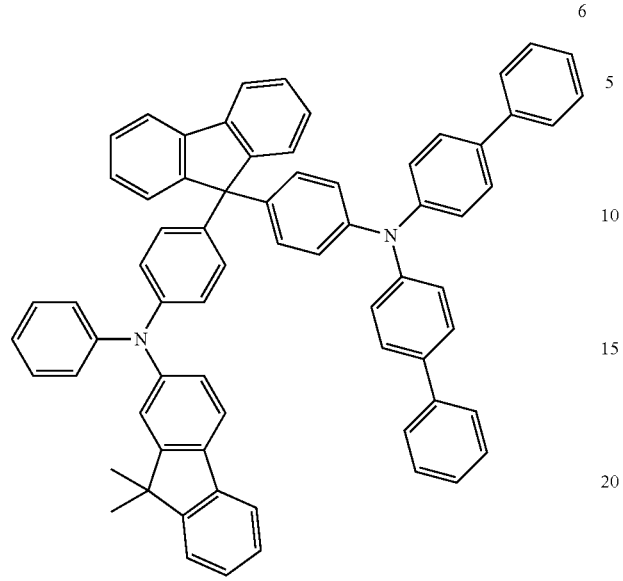
6
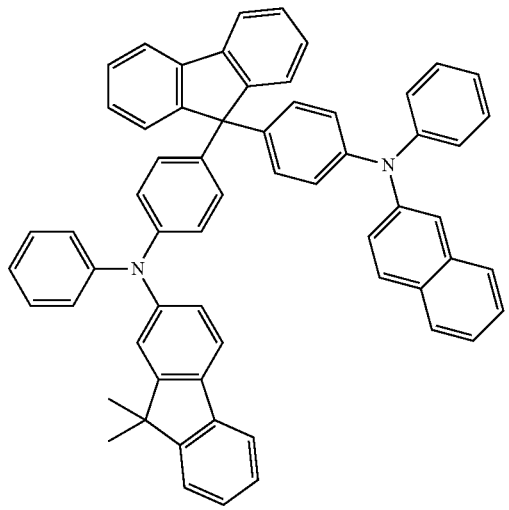
9
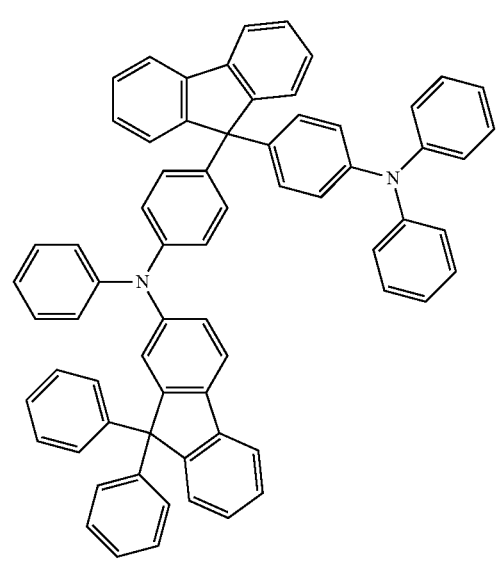
7
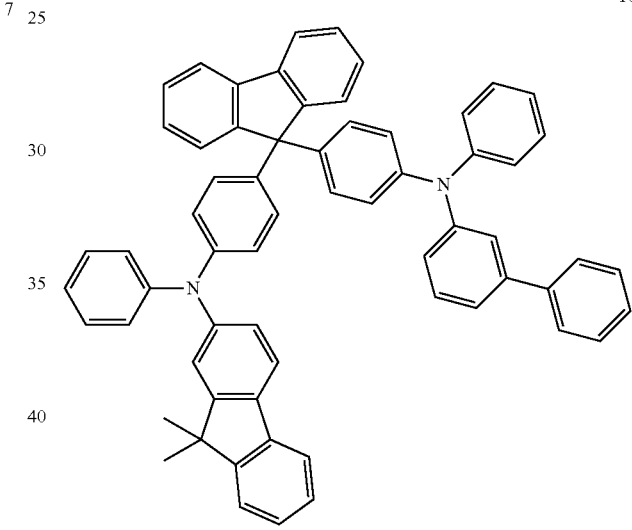
10
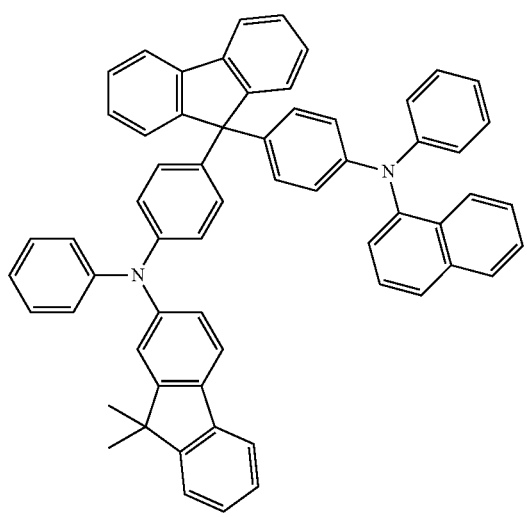
8
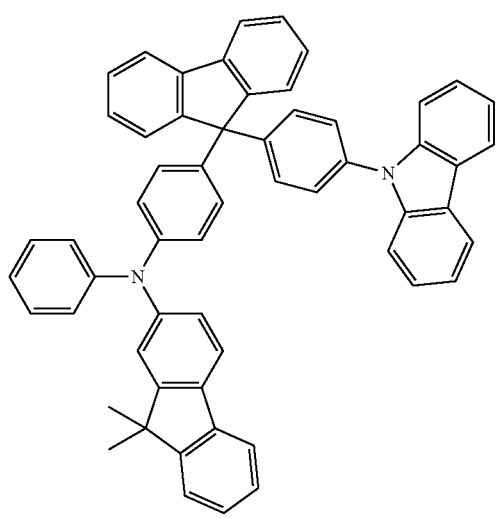
11

63
-continued
12
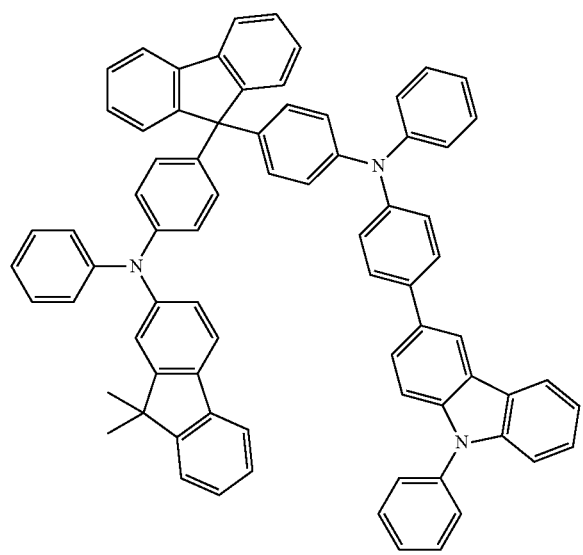
13
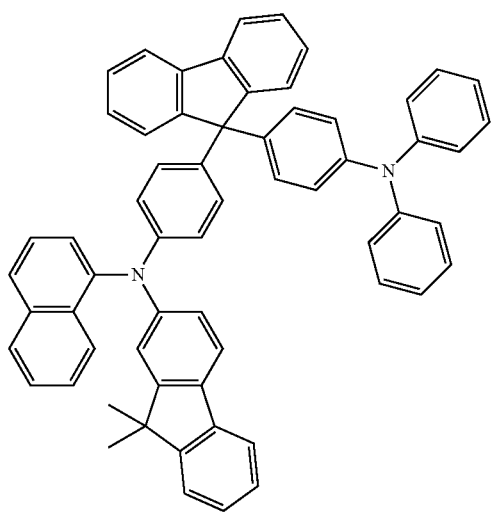
14
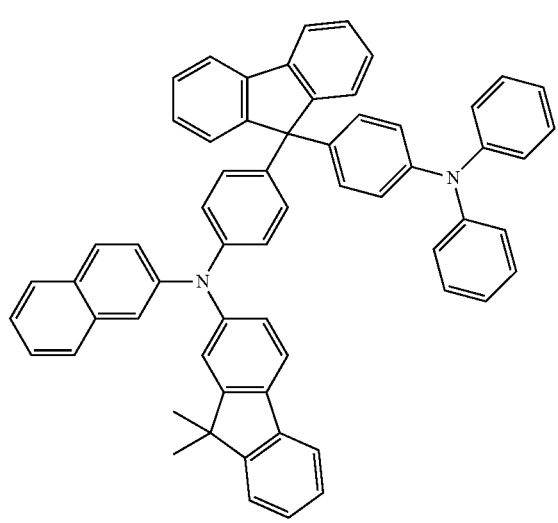
64
-continued
15
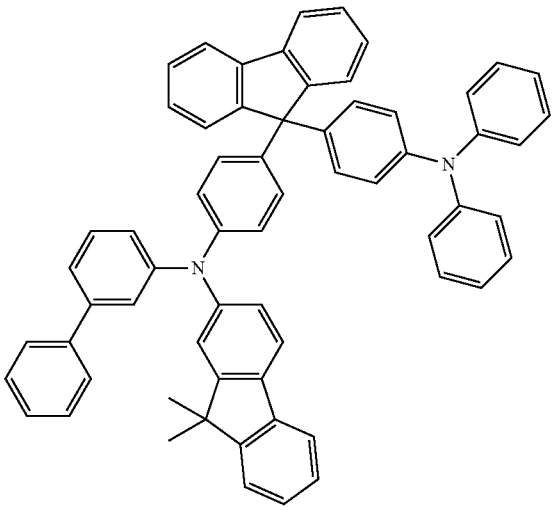
16
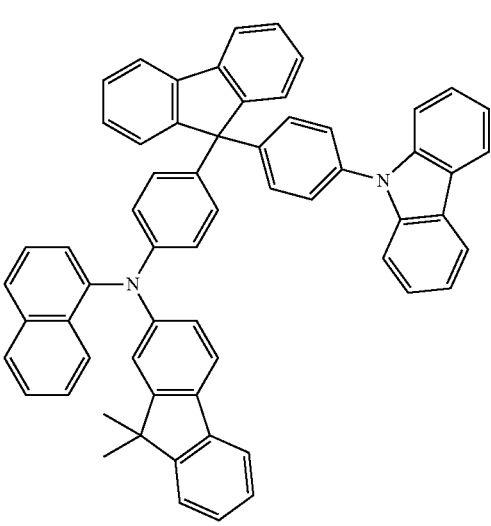
17
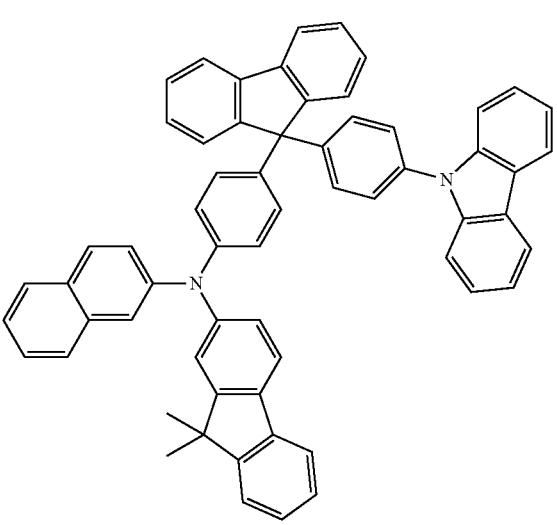

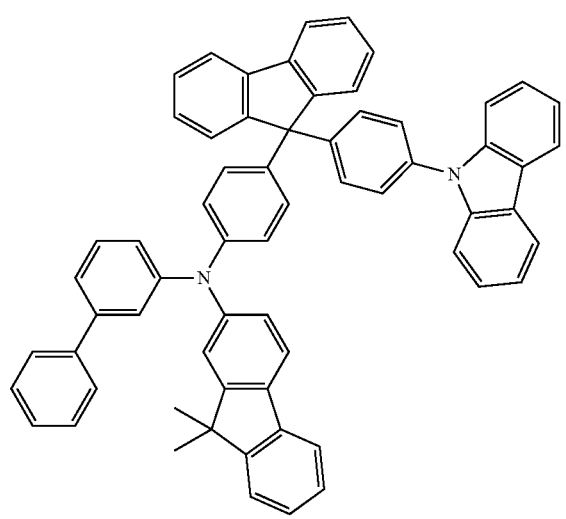
18
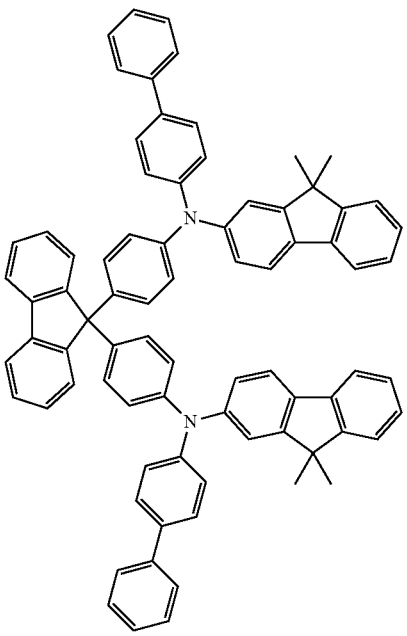
21
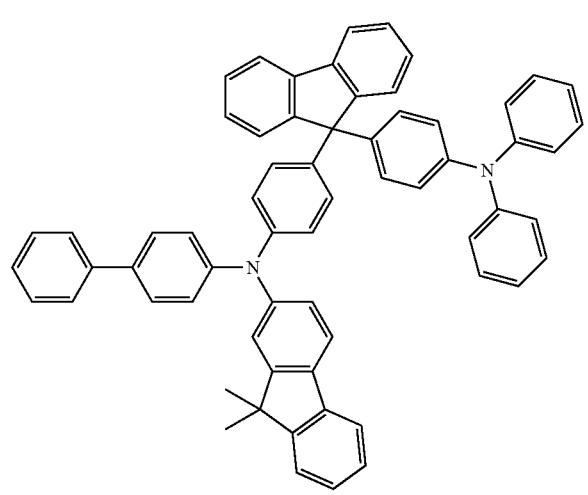
19
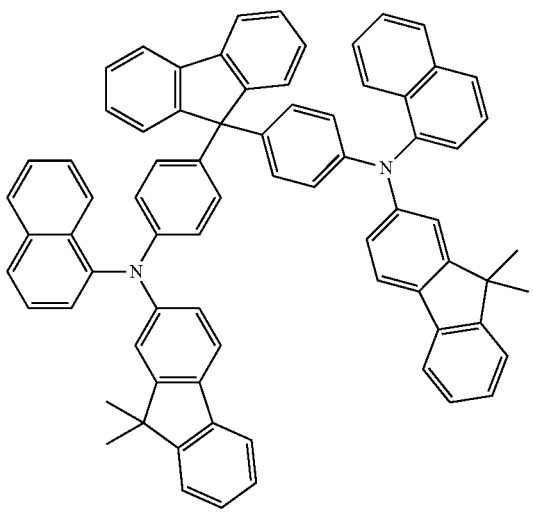
22
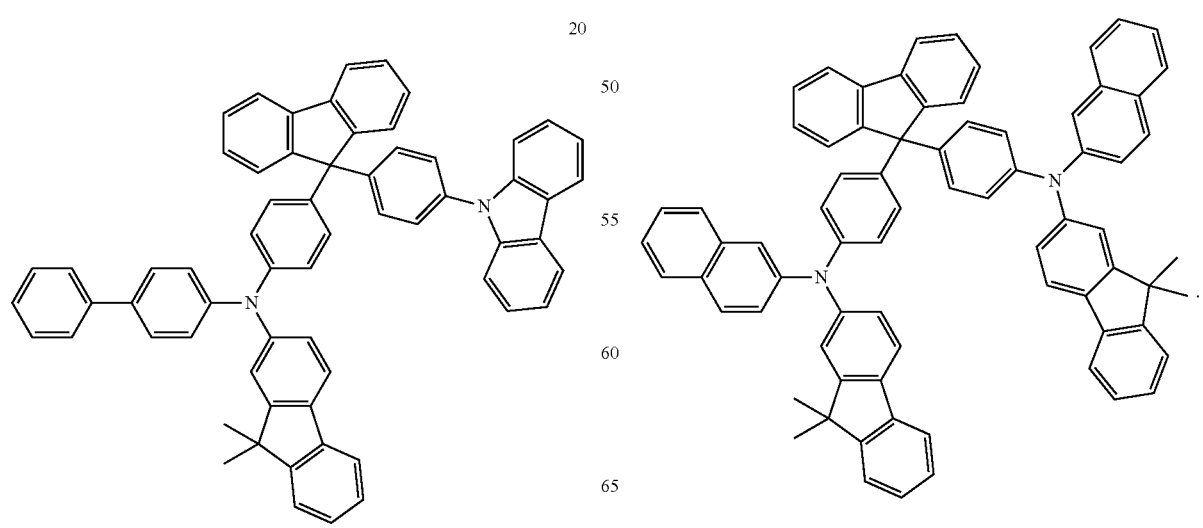
20
23

14. An organic light-emitting device comprising
a first electrode;
a second electrode disposed opposite to the first electrode; and
an organic layer disposed between the first electrode and the second electrode, and the organic layer comprising an emission layer (EML);
wherein the organic layer comprises at least one of the fluorene-based compounds of claim 1.

15. The organic light-emitting device of claim 14, wherein the organic layer further comprises
at least one layer selected from among a hole injection layer (HIL), a hole transport layer (HTL), a functional layer having both hole injection and hole transport capabilities at the same time, a buffer layer, and an electron blocking layer (EBL) disposed between the first electrode and the EML, and
at least one layer selected from among a hole blocking layer (HBL), an electron transport layer (ETL), and an electron injection layer (EIL) disposed between the EML and the second electrode,
wherein the at least one layer disposed between the first electrode and the EML comprises the fluorene-based compound.

16. The organic light-emitting device of claim 14, wherein the organic layer comprises an HTL disposed between the first electrode and the EML, and where the fluorene-based compound exists in the HTL.

17. The organic light-emitting device of claim 15, wherein the at least one layer disposed between the first electrode and the EML further comprises a charge-generating material.

18. The organic light-emitting device of claim 14, wherein the EML comprises an organometallic complex having at least one of Ir, Pt, Os, Ti, Zr, Hf, Eu, Tb, and Tm.

* * * * *